(12) United States Patent
Meguro et al.

(10) Patent No.: US 7,390,695 B2
(45) Date of Patent: Jun. 24, 2008

(54) DIAMOND SUBSTRATE AND MANUFACTURING METHOD THEREOF

(75) Inventors: Kiichi Meguro, Itami (JP); Keisuke Tanizaki, Itami (JP); Akihiko Namba, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 212 days.

(21) Appl. No.: 11/390,333

(22) Filed: Mar. 28, 2006

(65) Prior Publication Data

US 2006/0213428 A1  Sep. 28, 2006

(30) Foreign Application Priority Data

| Mar. 28, 2005 | (JP) | ............................. 2005-090607 |
| Mar. 28, 2005 | (JP) | ............................. 2005-091897 |
| May 2, 2005 | (JP) | ............................. 2005-133870 |
| Oct. 6, 2005 | (JP) | ............................. 2005-293130 |

(51) Int. Cl.
*H01L 21/00* (2006.01)

(52) U.S. Cl. ............................. 438/105; 257/E21.041; 257/E21.095

(58) Field of Classification Search ................ 438/105, 438/597, 618, 629, 650; 257/E23.111, E21.041, 257/E21.095, E21.096, E21.105, E21.107
See application file for complete search history.

(56) References Cited

U.S. PATENT DOCUMENTS 5,313,094 A * 5/1994 Beyer et al. .................. 257/622
2005/0029095 A1 * 2/2005 Hall et al. .................... 204/400

FOREIGN PATENT DOCUMENTS

JP  8-208387  8/1996

* cited by examiner

*Primary Examiner*—Brook Kebede
(74) *Attorney, Agent, or Firm*—McDermott Will & Emery LLP

(57) ABSTRACT

A manufacturing method for a large-scale diamond substrate and the produced substrate that is suitable for semiconductor lithography processing and large-scale optical parts, semiconductor materials, thermal-release substrate, semiconductor wafer processing, back-feed devices, and others. The manufacturing method of the present invention includes: preparing a substrate having a main face including a first region which is a concave and a second region which surrounds the first region, and mounting, on the first region, a single crystalline diamond seed substrate having a plate thickness thicker than the concave depth of the first region; forming a CVD diamond layer from the single crystalline diamond seed substrate using a chemical vapor deposition, and mutually connecting by forming a CVD diamond layer on the second region at the same time; and polishing to substantially flatten both the CVD diamond layers and on the second region by mechanically polishing.

44 Claims, 13 Drawing Sheets

(a)

(b)

(c)

(a)

(b)

(a)

(b)

PERCENTAGE OF FALLING OFF SINGLE CRYSTAL DIAMOND SEED SUBSTRATE

AMOUNT OF STAGE DIFFERENCE OF SINGLE CRYSTAL DIAMOND SEED SUBSTRATE [μm]

(a)

(b)

(a)

(b)

(a)

(b)

DIAMOND SUBSTRATE AND MANUFACTURING METHOD THEREOF

TECHNICAL FILED

The present invention relates to a substrate that includes a diamond single crystal and the manufacturing method thereof, and more particularly to a large-scale diamond substrate and manufacturing method thereof suitable for a semiconductor lithography process, large-scale optical parts, semiconductor materials and heat-release substrates and others. Further, the present invention relates to a large-scale conductive diamond substrate and manufacturing method thereof applicable to a semiconductor wafer process or the like, and applicable to the production of back-feed devices.

BACKGROUND ART

Diamond provides numerous superior characteristics such as high thermal conductivity, high electron/hole mobility, high dielectric breakdown field, low dielectric loss and wide band gap, and nothing else is similar as a semiconductor material. Specifically, electric field transistors with high frequency characteristics have recently been developed, and are expected to be used as power device semiconductors. Diamond has a negative electron affinity, and research on practical use as an electron emitter element is in progress. Regarding optical characteristics, diamond also has high transmissivity in the ultraviolet region (225 to 400 nm) and a high refractive index. For these reasons, it is anticipated that diamonds will be used as pick up lens materials that can accommodate the increasingly shorter wavelengths in conjunction with the increasingly high density of optical disks, etc.

It is necessary to have large-scale single crystal substrate equal to that of other semiconductor materials in order to use diamond as a semiconductor or an optical material. This is because semiconductor wafer processing and the equipment thereof, which are required for manufacturing devices, have been designed with assuming wafers with a diameter of several inches. Currently, high-temperature, high-pressure synthesis and chemical vapor deposition (CVD) are being industrially developed as methods to obtain large-scale diamond single crystals, and a large-scale substrate having a diameter of about 10 mm in a (100) surface can be obtained. However, at the current point in time this does not reach the goal of achieving a large diameter of not less than 1 inch. Specifically, a diamond substrate having a (111) face orientation, which can be doped with phosphorus and easily obtains n-type conductivity, is a several mm angle size in a mass-production commercial product manufactured by high-temperature high-pressure synthesis, and is difficult to make large-scale and maintain satisfactory crystallinity quality during chemical vapor deposition. In contrast, the heteroepitaxial growth that allows diamond single crystal to grow on a comparatively large-scale heterogeneous substrate does not currently have sufficient crystallinity, and practical applications in semiconductors and in optical uses are limited.

In order to resolve these problems, for example, Japanese Patent Publication No. H8-208387 disclosed an example of a diamond component that combined the advantages of both single crystalline diamond with satisfactory crystallinity and polycrystalline diamond for obtaining a large surface area by surrounding single crystalline diamond having a surface of 1 mm$^2$ or more with polycrystalline diamond.

The diamond part of Japanese Patent Publication No. H8-208387 is mainly intended for sensors and optical windows, etc., and it is necessary to grow high quality single crystals on single crystal substrate. Because (100) single crystal is used as seed crystal in order to grow high quality single crystals, it is difficult to form an n-type layer on this substrate by phosphorus doping. Moreover, in the example of arranging single crystal substrate on a flat silicon substrate, the film formation time in order to achieve sufficient bonding required 220 hours, and this is a disadvantage for productivity. Further, in an example in which a silicon substrate was processed to form a concave and a single crystalline diamond substrate is embedded into the recess processed, the heights of the silicon substrate main face and of the single crystalline diamond substrate main face coincide. Because the heights of both surfaces coincide, it is not possible to completely remove the chemical vapor deposition single crystalline diamond layer on the single crystalline diamond substrate by polishing, etc., and it is not possible to expose and utilize a single crystalline diamond substrate part with satisfactory crystallinity, either.

Moreover, single crystalline diamond substrates indicated in Japanese Patent Publication No. H8-208387 are insulative type IIa and type Ib diamonds at room temperature, are undoped single crystalline diamonds, and cannot be used as semiconductor devices as is. Because the silicon substrate exemplifying the diamond part substructure is also insulative at room temperature, it is not possible to use in a sensor, etc. unless the silicon substrate is removed and electrodes and conductive diamond films are formed again. The insulative diamonds, as explained in Japanese Patent Publication No. H8-208387, are processed by a laser cutting, but the processing speed poses difficulties. Further, in order to arrange a single crystalline diamond substrate on a silicon substrate and to cover over this with polycrystalline diamond, it is necessary to form sufficiently thick polycrystalline diamond, and the throughput has difficulties.

DISCLOSURE OF THE INVENTION

An object of the present invention is to solve the aforementioned problems, and to provide a large-scale diamond substrate and manufacturing method thereof suitable for semiconductor lithography processing, optical parts, semiconductor materials and heat-release substrates, etc. Another object is to provide a large-scale conductive diamond substrate and manufacturing method thereof applicable to semiconductor wafer processing, etc., and to manufacturing back-feed devices.

In order to solve the aforementioned problems, the present invention provides the following first aspect.

Specifically, the present invention provides a method for manufacturing a diamond substrate, comprising:

a mounting step of preparing a substrate having a main face comprising a first region which is a concave and a second region which surrounds the first region, and mounting, on the first region, a single crystalline diamond seed substrate having a plate thickness thicker than a depth of the concave of the first region;

a connecting step of forming a CVD diamond layer from the single crystalline diamond seed substrate by a chemical vapor deposition, and mutually connecting by forming a CVD diamond layer on the second region at the same time; and a polishing step of polishing to substantially flatten both the CVD diamond layer on the single crystalline diamond seed substrate and the CVD diamond layer on the second region by mechanically polishing.

Silicon substrate or conductive substrate is suitable as the aforementioned substrate having a main face. When using conductive substrate, by forming both the single crystalline diamond seed substrate and the CVD diamond layer to have conductivity, a diamond substrate becomes suitable for use in semiconductor devices.

In addition, the present invention has the following second aspect.

Specifically, the present invention provides a diamond substrate comprising:

a substrate having a main face comprising a first region, which is a concave, and a second region which surrounds the first region, a plate-shaped single crystalline diamond part provided on the first region, and a layer-shaped polycrystalline diamond part provided on the second region, wherein the single crystalline diamond part is secured to the substrate by connecting with the polycrystalline diamond part, and the single crystalline diamond part and the polycrystalline diamond part are substantially flattened and unified.

Silicon substrate or conductive substrate is suitable as the aforementioned substrate having a main face. When using conductive substrate, by forming both the single crystalline diamond part and the polycrystalline diamond part to have conductivity, the diamond substrate becomes suitable for use in semiconductor devices.

An explanation will be given below of a silicon substrate being used as the substrate having a main face.

As a typical manufacturing method for the substrate of the present invention, a single crystalline diamond seed substrate is inserted in a first region, specifically, in a concave of a silicon substrate main face, and the silicon substrate and the single crystalline diamond seed substrate are connected through a CVD diamond layer. With the single crystalline diamond seed substrate inserted in the concave of the silicon substrate, a gas phase CVD diamond layer is formed on this main face. Then, the CVD diamond layer grows respectively onto the single crystalline diamond seed substrate and onto the second region, which is the main face of the silicon substrate surrounding the concave. The layer spread horizontally a little at a time as it grows, and embeds the gap between the silicon substrate and the single crystalline diamond seed substrate. Both substrates are thereby firmly connected by diamond, and the surface can be mechanically polished. Next, the CVD diamond layer is polished away until the single crystalline diamond seed substrate is exposed. The mechanically polished surface comprises a single crystalline diamond seed substrate part and the surrounding CVD diamond part, and the single crystal seed substrate part can be used as high quality single crystal for semiconductors and optical applications. According to this manufacturing method, the diamond single crystal seed substrate provides the single crystalline diamond part of the diamond substrate of the present invention, and the CVD diamond layer serves as the polycrystalline diamond part.

In the diamond substrate and manufacturing method thereof of the present invention, by making the plate thickness of the single crystalline diamond seed substrate thicker than the depth of the concave, the seed substrate will be supported and not fall off even if the diamond is polished by mechanical polishing up to the seed substrate top surface. There is the advantage that the seed substrate orientation and growth conditions of the CVD diamond can be freely selected in either case that the diamond layer grown on the seed substrate by chemical vapor deposition is a single crystal or a polycrystal. When forming the CVD diamond, even if cracking appears on the single crystal seed substrate or CVD diamond layer because of warping such as synthesis stress, this cracking and stress region can be removed by a polishing step, and a high quality single crystal seed substrate region with no warping can be used. Also, the surface of the diamond substrate after polishing is substantially flattened and unified. As will be described later, in the present invention, substantially flattened and unified includes the generation of micro-grooves around the single crystalline diamond seed substrate and slight stage differences between the main face of the seed substrate and that of the diamond layer on the silicon substrate.

The shape of the concave formed on the silicon substrate used in the present invention, when viewed from above the main face, is a circle, ellipse, or polygon having at least one corner with a corner angle of 60° or more between the extended lines of two sides, and preferably all the corner radii of the aforementioned polygon are 50 μm or more. In addition, as indicated in FIG. 1, the polygon in the present invention includes a shape with the corners a little rounded off. Meanwhile, when viewed from above the main face, the single crystalline diamond seed substrate mounted in the concave formed on the silicon substrate is a circle, ellipse, or polygon having at least one corner with a corner angle of 60 degrees or more between the extended lines of two sides, and preferably all the corner radii of the aforementioned polygon are 50 μm or more. In the same way as with the shape of the concave, the single crystalline diamond seed substrate in the present invention includes a polygonal shape with the corners lightly rounded off as indicated in FIG. 1.

Thereby, the gap is uniform when inserting the single crystalline diamond seed substrate in the aforementioned concave, and during chemical vapor deposition the CVD diamond completely covers the gap and the junction with the single crystalline diamond seed substrate is stronger. Also, the falling off the corner part during polishing is prevented.

Mechanical processing such as end-milling or drilling, wet etching, or dry etching is preferable as methods to form the concave in the silicon substrate. Mechanical processing or wet etching can be performed economically and quickly, and dry etching can produce a highly precise concave shape.

The single crystalline diamond seed substrate to be used preferably is 1 mm² or more in size, and has a thickness of 100 μm or more. A single crystalline diamond seed substrate that is smaller than the aforementioned size is difficult to handle. Inserting the single crystalline diamond seed substrate and processing the concave shape of the silicon substrate main face is also difficult.

Regarding the size of the concave formed on the silicon substrate with respect to the size of the single crystalline diamond seed substrate, the amount of gap, which is the maximum circumferential gap, is preferably 200 μm or less. More preferably, the gap is 20 μm or more and 100 μm or less. The single crystalline diamond seed substrate and the silicon substrate can thereby be connected by forming a minimum CVD diamond layer.

When arranging the single crystalline diamond seed substrate in the first region, the amount of stage difference, which is the stage difference between the seed substrate top surface after placement and the surface of the second region that is the silicon substrate surface other than the concave, is preferably 20 μm or more and 300 μm or less, and more preferably, is 30 μm or more and 100 μm or less. By making the aforementioned stage difference be a suitable height, the bonding strength between the single crystalline diamond seed substrate and the CVD diamond grown from the silicon substrate main face part is heightened, and the single crystalline diamond seed substrate can be easily exposed during the polishing step.

Further, it is preferable for the relationship between the aforementioned amount of stage difference and the amount of gap that a ratio of the amount of stage difference to the amount of gap is 0.3 or more and 120 or less. This is specifically explained in the Examples described later, but by using silicon substrate and single crystalline diamond seed substrate to make the ratio of the amount of stage difference to the amount of gap fall within this range, hardly any seed substrate will fall off from the substrate during the subsequent polishing step. The yield in the manufacturing process can thereby be greatly improved.

The single crystalline diamond seed substrate used in the present invention can have a main face of orientation (111). Single crystalline diamond with an orientation of (111) is possible to be doped both with phosphorus and boron, and therefore, large-scale n-type and p-type single crystal devices can be easily produced using the diamond substrate of the present invention. Because a (111) plane is the most difficult surface to polish, often (111) single crystal after normal polishing does not strictly have an orientation of a (111) plane, and has an orientation with a discrepancy of several degrees from a (111) plane. Because polishing for the single crystalline diamond seed substrate of the present invention is performed after securing the periphery of the seed substrate by CVD diamond, it is possible to form a (111) plane with less discrepancy than the normal (111) single crystal body has. If the surface of the single crystalline diamond seed substrate obtained after polishing has a discrepancy from a (111) plane within 5 degrees, then subsequent phosphorus doped diamond formation can be effectively achieved. According to the method of the present invention, it is fully possible to make the discrepancy small enough to fit within this range. However, the single crystalline diamond seed substrate used in the present invention is not limited to (111), and single crystal of (100) or any high index surface of (110) or more can also be used.

Naturally produced single crystals or single crystals obtained by high-temperature high-pressure synthesis or chemical vapor deposition can be utilized for the single crystalline diamond seed substrate in the present invention, but preferably type Ib single crystals, or more preferably, type IIa single crystals obtained by high-temperature high-pressure synthesis are used. Using these single crystals having good crystallinity as the seed substrate has advantages when making a diamond substrate for semiconductors and then forming a doped layer.

As the silicon substrate used in the present invention, either single crystals of an optional orientation or polycrystals can be utilized, but preferably, single crystals that have a main face of (111) orientation are used. If (111) single crystals are used for a single crystalline diamond seed substrate, the silicon substrate and the orientation align, and the joining characteristics between the chemical vapor deposition diamond grown from the silicon substrate main face area and the single crystalline diamond seed substrate are improved.

It is desirable that the silicon substrate used in the present invention have a wafer shape with a diameter of 2 inches or more and a thickness of 0.3 mm or more and 5 mm or less. A diamond substrate that has a large surface area and is applied to wafer processing can thereby be provided.

The CVD diamond layer formed on the silicon substrate and single crystalline diamond seed substrate is a polycrystalline diamond, and more preferably, is a (111) oriented diamond. When a (111) single crystal is used as the single crystalline diamond seed substrate, polycrystallization of the CVD diamond on the seed substrate will occur. If the diamond formed on the silicon substrate at this time is a polycrystal, the junction with the diamond seed substrate will be strong. If the CVD diamond on the seed substrate is a (111) single crystal or a (111) oriented diamond, and if the diamond on the surrounding silicon substrate is also the same (111) oriented diamond, both will form a tight junction. Further, unevenness (distribution) of the polishing speed in the subsequent polishing step caused by difference of the crystal plane can be prevented, and uniform diamond substrate can readily be obtained across the entire surface.

The (111) oriented surface described here means a surface on which the perpendicular direction to the surface is parallel to (111), and accordance of the rotational direction within the plane is not considered. X-ray diffraction is used as a typical method to evaluate the orientation. Using the θ/2θ method with Kα radiation from a copper sphere and evaluating the diamond substrate top surface across 2θ=40 to 120°, the surface is identified to be a (111) orientation when the (111) diffraction peak percentage that appears in the vicinity of 2θ=43.9° is larger than the (111) diffraction peak percentage of the reference diamond powder. The determination may also use methods other than θ/2θ.

The film thickness distribution of the CVD diamond layer synthesized on the silicon substrate main face part is preferably 30% or less, and more preferably 10% or less. Shortening of the polishing time in the subsequent polishing step may thereby be anticipated.

By removing the Si substrate part on the diamond substrate back surface and the single crystalline diamond seed substrate embedded in the silicon substrate concave by means of a mechanical method such as grinding, the substrate can be used as an independent type diamond substrate. The diamond substrate thereby becomes thinner, and may be easily adapted to conventional wafer processes.

After the polishing step it is preferable that warpages of the diamond substrate top surface (diamond surface) and the back surface (silicon surface) are within ±10 μm. Here, warpage is expressed by the difference between the maximum and minimum points in the surface when the diamond substrate is secured and arranged on a flat plate, and the + direction is defined as the convex direction (convex upward). Confining the diamond substrate warpage to within the aforementioned range makes utilization in subsequent semiconductor wafer processing, etc. easy.

After the polishing step, the thickness of the CVD diamond layer on the second region is preferably 10 μm or more. The thickness distribution of the CVD diamond layer is preferably 10 μm or less. If the thickness of the diamond layer is less than 10 μm, the junction with the single crystalline diamond seed substrate becomes weak, and when later forming the doped diamond layer (with temperature change), the likelihood of the single crystalline diamond seed substrate falling off in the semiconductor wafer process is high. If the thickness distribution of the CVD diamond layer is greater than 10 μm, the surface uniformity in the subsequent semiconductor wafer process is worsened.

A further characteristic of the diamond substrate and manufacturing method thereof of the present invention is that a groove surrounding the surface of the single crystalline diamond seed substrate can be partially or completely produced during the polishing step. Normally, it is difficult to distinguish the regions of the diamond substrate top surface after polishing because the single crystal seed substrate and the surrounding CVD diamond are unified. For example, to distinguish the regions is difficult when subjecting to photolithography processing later, then identifying the region to be processed for devices will be troublesome. In order to solve this, if specific polishing conditions are used, it will be possible to generate a complete or partial grove around the single crystalline diamond seed substrate top surface as previously described. Specifically, a grove of the desired size is naturally formed by varying the load during polishing and suitably selecting as indicated in the Examples to be described later. However, even if a groove is produced, it is desirable that the depth is no more than 3 μm and the width is no more than 20 μm. Restricting the size of this groove to be within the aforementioned range can prevent film thickness distribution when the substrate is coated with photoresist. There is no difference in effect whether one or two or more of these grooves are made. If multiple grooves are made, it is preferable that the depth and width of each fall within the aforementioned range.

The stage difference between the single crystalline diamond seed substrate exposed in the surface after the polishing step and the surrounding CVD diamond layer is preferably no more than 1.2 μm. The range of this stage difference is the same either when the single crystalline diamond seed substrate is higher than the surrounding region or lower. Film thickness distribution when coated with photoresist can thereby be prevented, and exposure processing during the photolithography process can be satisfactorily conducted.

Whether to expose the single crystalline diamond seed substrate by polishing can be determined by measuring the amount of shift and full width at half maximum value of the diamond peak by Raman spectroscopy. If using an Ar laser (wavelength of 514.5 nm) for Raman excitation light, the Raman shift of the single crystalline diamond seed substrate top surface after polishing is preferably $1332\pm1$ cm$^{-1}$, and the full width at half maximum is preferably no more than 2.5 cm$^{-1}$. Whether the single crystalline diamond seed substrate has been exposed can be easily determined by comparing the Raman shift and the full width at half maximum before and after the polishing step. However, the wavenumber resolution of the device when applying the aforementioned full width at half maximum shall be 1.9 cm$^{-1}$.

The surface roughness of the single crystalline diamond seed substrate top surface after the polishing step is preferably an Ra of 10 nm or less. This Ra can be easily measured by atomic force microscopy (AFM). By restricting the surface roughness to within the aforementioned range, the subsequent semiconductor diamond synthesis and semiconductor wafer process can be satisfactorily conducted.

The use in the present invention of a conductive substrate as the substrate having a main face will be explained below. In this case, it is preferable that both the single crystalline diamond seed substrate and the CVD diamond layer are conductive.

The present invention serves a large-scale conductive diamond substrate by placing a conductive single crystalline diamond, which can be used as a semiconductor, on a conductive substrate and by securing the conductive single crystalline diamond via conductive polycrystalline diamond. The semiconductor substrate can be used as is because the substrate is comprised of all conductive materials, and devices can be readily formed and cut out by electric discharge machining. By employing a large-scale conductive substrate it is possible to introduce conductive single crystalline diamond, namely, semiconductor diamond, to semiconductor wafer processing. Further, because electric power can be fed from the rear face of the substrate, which is opposite side of the substrate side mounted on the diamond, there is the advantage that the terminal structure of the diamond side can be simplified, widening the flexibility for device applications.

As a typical method, chemical vapor deposition is used to connect the conductive single crystalline diamond and the conductive polycrystalline diamond, and to obtain the diamond substrate of the present invention. With chemical vapor deposition, the diamond grows not only upwardly but also horizontally, therefore, both surfaces can be easily connected. Here, both artificial conductive diamond obtained by high-temperature high-pressure synthesis, and natural conductive diamond can be utilized as the conductive single crystalline diamond substrate part. The orientation of this conductive single crystalline diamond substrate is preferably any of (100) plane, (110) plane, or (111) plane, or within the discrepancy range of $\pm10°$ or less of these. By using these substrates, epitaxial growth of the conductive part becomes easier during subsequent chemical vapor deposition.

When forming by chemical vapor deposition, the conductive diamond formed on the conductive single crystalline diamond substrate mounted in the concave of the conductive substrate may be a conductive polycrystalline diamond, or a conductive single crystalline diamond, namely, a diamond grown epitaxially. If this region is a conductive single crystalline diamond grown epitaxially, the diamond may be used as is as a device. But, even if it is a conductive polycrystalline diamond, the substrate can be used as a semiconductor device by removing this layer by etching, polishing or electric discharge machining, and exposing the conductive single crystalline diamond substrate part. By using etching or polishing to flatten the diamond part of the surface there is the advantage of easy adaptation to the semiconductor wafer process.

In the diamond substrate of the present invention, conductive single crystalline diamond is mounted on a first region having a concave formed on a conductive substrate, and this must be secured by connecting with conductive polycrystalline diamond provided in a second surrounding region. By inserting the conductive single crystalline diamond in the concave, movement during connection can be prevented and the conductive single crystalline diamond can be tightly secured to the conductive substrate. There may be one or multiple locations of this first region having a concave on the conductive substrate. There may be one or a multiple array of conductive single crystalline diamonds mounted in one concave. By forming multiple units, multiple conductive single crystalline diamond regions are present on one diamond substrate thereby improving efficiency for making devices.

The plate thickness of the conductive single crystalline diamond is preferably greater than the depth of the concave formed in the conductive substrate. A strong connection can thereby be made between the conductive single crystalline diamond and the conductive polycrystalline diamond even if the thickness of the conductive polycrystalline diamond part is relatively thin. Further, when forming the conductive diamond layer by chemical vapor deposition, even if the diamond formed on the conductive single crystalline diamond substrate is removed by etching or polishing, the conductive single crystalline diamond substrate part can be used in devices, etc., because the conductive single crystalline diamond substrate and the surrounding conductive polycrystalline diamond are connected.

The resistivity of the conductive single crystalline diamond part, conductive polycrystalline diamond part and conductive substrate is preferably $1\times10^{-1}$ Ω·cm or less. By using low resistance diamond and substrate, highly efficient and energy-saving devices can be produced. Moreover, low resistance substrate is easy to process and form by electric discharge machining.

The conductive single crystalline diamond and conductive polycrystalline diamond of the present invention preferably contain one or more elements selected from the group of consisting of hydrogen, lithium, boron, nitrogen, aluminum, silicon, phosphorus and sulfur, as impurities. By containing these elements in the diamond, the diamond becomes a semiconductor and exhibits conductivity at room temperature. In particular, because boron is readily incorporated into diamond and can easily make the diamond have low resistance, boron is a more suitable element to obtain the diamond substrate of the present invention. Well-known technologies to add impurity elements when conducting high-temperature high-pressure synthesis and chemical vapor deposition, as well as ion implantation may be used as methods to incorporate these impurities into the diamond.

The conductive substrate used in the present invention may utilize any optional material such as metal or ceramic as long as the material is conductive, but it is preferable to contain at least one material selected from the group consisting of silicon, silicon carbide, silicon nitride, aluminum nitride and boron nitride. By using these materials tight adhesion with the diamond and satisfactory conductivity can be maintained, and wafer processing can be made easy. Any form of these materials, such as single crystal, polycrystal or sintered body, can be used as a substrate. When the size of the conductive substrate is a diameter of 2 inches or more and a thickness of 1 mm or less, then devices can be readily produced in subsequent wafer processing, etc.

The diamond substrate manufacturing method of the present invention can use chemical vapor deposition to conduct the step of forming the conductive diamond part, and then using electric discharge machining to cut the diamond substrate. Electric discharge machining can also be utilized to form the unevenness in the surface of the diamond, and is helpful in making device chips inasmuch as conductive single crystalline diamond parts can be cut out at high speed.

The technological effects brought by the diamond substrate and manufacturing method thereof of the present invention are summarized below.

The diamond substrate and manufacturing method thereof of the present invention can offer manufacturing of large surface area diamond substrate that is easily handled in wafer processing, etc. If the diamond substrate and manufacturing method thereof of the present invention is used, large-scale substrate and high quality diamond single crystalline parts having conductivity can be applied to semiconductor wafer processing, etc., and can also be utilized to manufacture backfeed devices, etc.

BEST MODE FOR CARRYING OUT THE INVENTION

The present invention will be explained in detail below based on Examples.

EXAMPLE 1

The manufacturing of the present Example comprises the following 4 steps.

The first is the step of preparing the silicon substrate and single crystalline diamond seed substrate respectively, forming the concave on the main face of the silicon substrate, and mounting the single crystalline diamond substrate in the concave of the silicon substrate main face (called "mounting step" hereinafter). The second is the step of using chemical vapor deposition to form a CVD diamond layer on the single crystalline silicon substrate main face and single crystalline diamond seed substrate main face thereby connecting both (called "connecting step" hereinafter). The third is the step of mechanically polishing the CVD diamond layer that grew on the single crystalline diamond seed substrate and on the silicon substrate main face (called "polishing step" hereinafter). Then the forth is a step to evaluate the completed product (called "evaluation step" hereinafter).

<Mounting Step>

Figure 1:
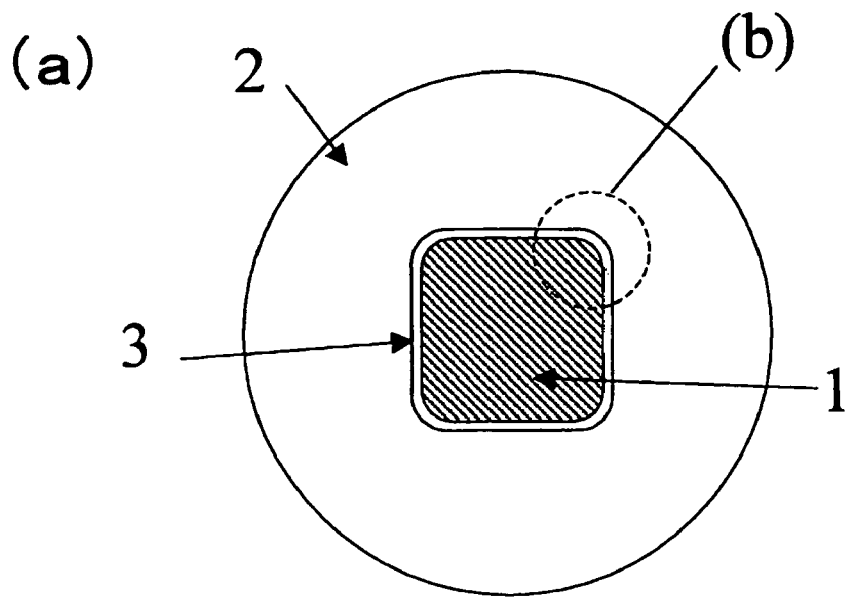
FIG. 1 is a schematic diagram of Example 1 with the mounting process completed. (a) is a top-view schematic diagram after single crystalline diamond seed substrate was mounted. (b) is an expanded schematic diagram of the single crystalline diamond seed substrate corner part. (c) is a cross-sectional schematic diagram of a mounted single crystalline diamond seed substrate.
Figure 1:
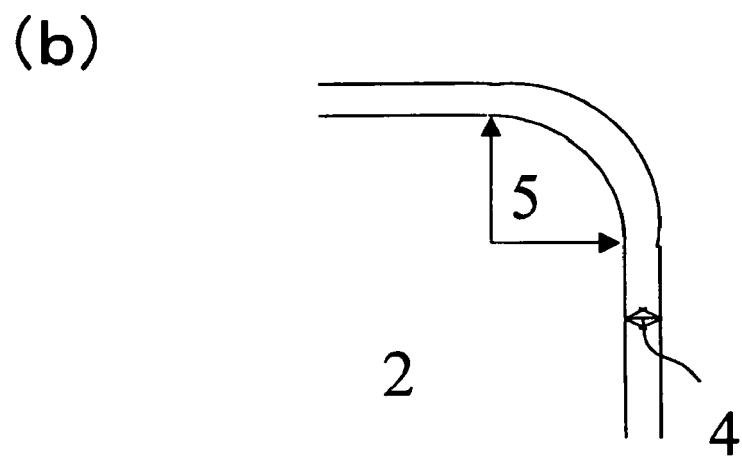
Figure 1:
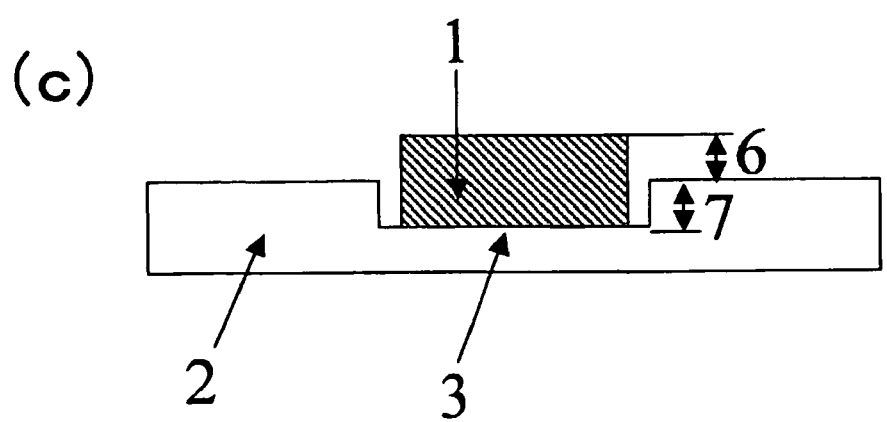

The mounting process is schematically indicated in FIG. 1. A single crystalline diamond seed substrate 1 prepared was a type Ib single crystalline diamond obtained by high-temperature high-pressure synthesis; the orientation of the main face was (100); the size was a square form with a length of 2 mm, width of 2 mm and a thickness of 300 μm; and the corner radius 5 of the 4 corners viewed from above the main face was 50 μm (FIG. 1(b)). A silicon substrate 2 was a polycrystalline body, and the size was a diameter of 2 inches and thickness of 1 mm. A first region 3, which was a concave, was formed by end mill processing on the silicon substrate main face, and the size was a length of 2.1 mm and a width of 2.1 mm. With the single crystalline diamond seed substrate mounted, there was a gap 4 of 50 μm between the single crystalline diamond seed substrate and silicon substrate concave (FIG. 1 (a), (b)). There was a stage difference 6 of 50 μm between the main faces of the single crystalline diamond seed substrate and the silicon substrate after the single crystalline diamond seed substrate has been mounted (FIG. 1 (c)).

<Connecting Step>

Here, both are connected by using chemical vapor deposition to form a diamond layer on the main faces of the single crystalline diamond seed substrate and the silicon substrate. Known microwave plasma CVD was used to form the CVD diamond. The diamond synthesis conditions were: a ratio of methane flow rate (methane flow rate/hydrogen flow rate) of 3%; a silicon substrate a temperature of 1000° C.; a pressure of $1.2 \times 10^4$ Pa; and a synthesis time of 30 hours.

Figure 2:
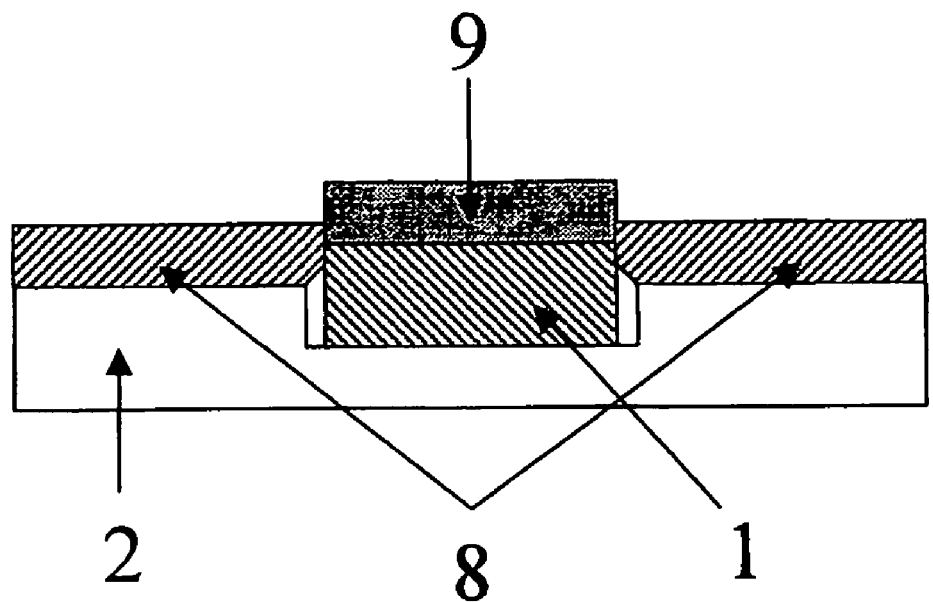
FIG. 2 is a cross-sectional schematic diagram of Example 1 after completing the connecting step.

A cross-section of the substrate after forming the CVD diamond layer is schematically indicated in FIG. 2. Both the CVD diamond layer 8 formed on the silicon substrate and the CVD diamond layer 9 formed on the single crystalline diamond seed substrate are polycrystal bodies. The thickness of the CVD diamond layer that grew from the main face of the silicon substrate was 60±8 μm, and the thickness of the CVD diamond layer which grew from the main face of the single crystalline diamond seed substrate was 80 μm.

<Polishing Step>

Figure 3:
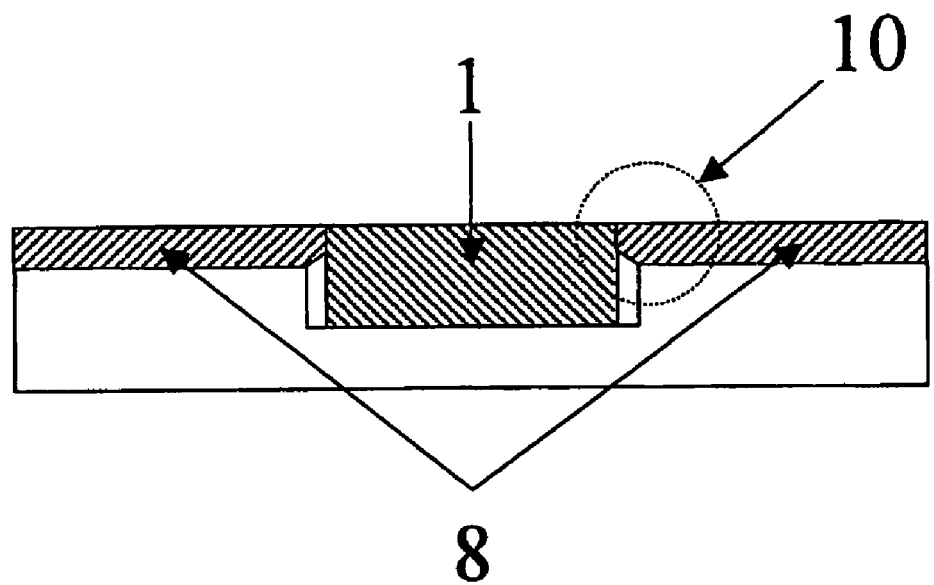
FIG. 3 is a cross-sectional schematic diagram of Example 1 after completing the polishing step.

A self-revolving dry polishing device was used to mechanically polish the CVD diamond layer which grew on the main faces of the single crystalline diamond seed substrate and the silicon substrate. The polishing load was 5 kg. After 40 hours of polishing, the single crystalline diamond seed substrate was exposed, and the entire surface was polished to a mirror finish. The thickness of the diamond substrate after polishing was 1.039 to 1.049 mm (the thickness of the CVD diamond layer was 39 to 49 μm). The amount of substrate warpage in this case was: the top surface (diamond surface) was (+) 10 μm convex, and the rear surface (silicon surface) was (−) 10 μm concave. A cross-section of the substrate after polishing is schematically indicated in FIG. 3. FIG. 3 demonstrates that the single crystalline diamond seed substrate was connected to the silicon substrate through the CVD diamond layer 8 formed on the silicon substrate.

<Evaluation Step>

Figure 4:
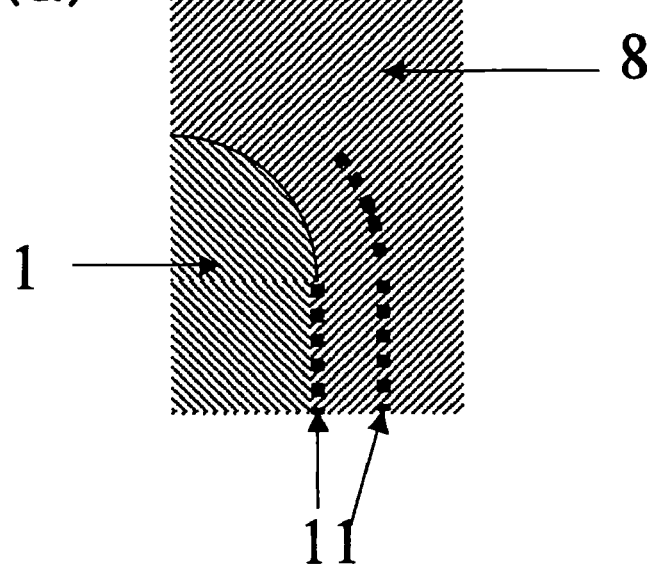
FIG. 4 is an expanded schematic diagram of Example 1 after completing the polishing step and it is an enlarged view of the surface junction region 10 in FIG. 3. (a) is a top-view expanded schematic diagram. (b) is a cross-sectional expanded schematic diagram.
Figure 4:
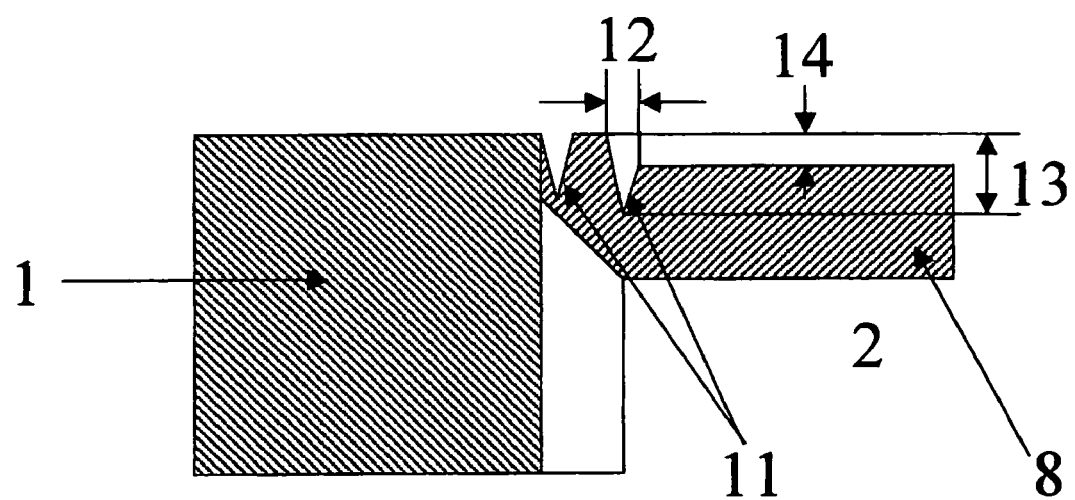

First, the part that connected the surfaces of the single crystalline diamond seed substrate and the polished CVD diamond layer surrounding it was observed with an optical microscope. FIG. 4 schematically indicates the surface junction region 10 in FIG. 3, and in the results, a double groove 11 produced in the junction region around the single crystalline diamond seed substrate was observed, and the groove partially surrounded the seed substrate top surface (FIG. 4(a)). The condition of the cross-section of the substrate is indicated in FIG. 4(b), and as a result of evaluating the size of this groove by atomic force microscopy (AFM), the inside groove depth was 354 nm and the width was 11 μm; and the outside groove depth 13 was 2.8 μm and the groove width 12 was 19 μm. The stage difference 14 between the single crystalline diamond seed substrate and the CVD diamond layer was 0.6 μm. The top surface roughness of the single crystalline diamond seed substrate was 2 nm in terms of Ra.

Whether the single crystalline diamond seed substrate was exposed by polishing was determined by Raman spectroscopic measurements. The Raman spectroscopic device used an Ar laser (wavelength of 514.5 nm) for the excitation light, and it was confirmed that the Raman shift of the single crystalline diamond seed substrate taken prior to formation of the CVD diamond was 1332 cm$^{-1}$, and the full width at half maximum was 2.2 cm$^{-1}$. Next, when measuring the Raman shift of the CVD diamond layer grown on the single crystalline diamond seed substrate in the <Connecting step>, the shift wavenumber was 1333.1 cm$^{-1}$ and the full width at half maximum was 3.8 cm$^{-1}$, and therefore deterioration of the crystal integrity was observed in the conjunction due to polycrystallization of the CVD diamond layer. Further, the Raman shift of the single crystalline diamond seed substrate top surface after the <Connecting step> was measured in the same way, and the shift wavenumber was 1332 cm$^{-1}$ and the full width at half maximum was 2.2 cm$^{-1}$, and therefore it was determined that polishing had removed the CVD diamond layer and exposed the seed substrate top surface.

The diamond substrate obtained this way was tested in photolithography as an example of semiconductor wafer processing. A positive type photoresist comprising a mixture of diazonaphtoquinone based photosensitive agent and novolac resin was spin coated on the surface of the substrate. As a result, the film thickness distribution of the resist on the single crystalline diamond seed substrate was 0.9%. Exposure testing was conducted for this diamond substrate, and it was demonstrated that exposure position alignment could be easily achieved and that the exposure position had no discrepancies during processing. As a comparative example of resist coating, a unit of single crystalline diamond seed substrate used in this Example was set in a spinner jig as is, and resist was spin coated using the same coating conditions as in the Example. In the results, the film thickness distribution of the resist on the single crystalline diamond seed substrate was 21%, indicating the superiority of the diamond substrate obtained in the Example.

COMPARATIVE EXAMPLE 1

Figure 5:
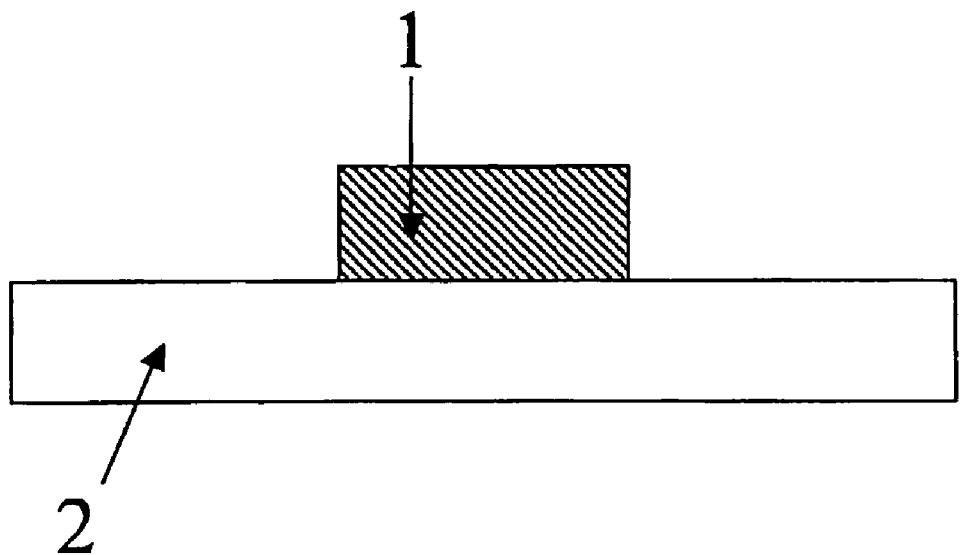
FIG. 5 is a schematic diagram of comparative example 1 with single crystalline diamond seed substrate mounted on a flat silicon substrate.

An example of production without forming the concave on the silicon substrate will be described here as comparative example 1. In this comparative example, single crystalline diamond seed substrate and silicon substrate with the same specifications as those of Example 1 were used, but as indicated in FIG. 5, in the <Mounting step> the single crystalline diamond seed substrate 1 was mounted as is on the flat surface without forming a concave in the silicon substrate 2. The <Connecting step> was the same as the Example, but when conducting the <Polishing step>, the single crystalline diamond seed substrate fell off during polishing. Therefore, this demonstrates the superiority of forming a concave in the silicon substrate.

COMPARATIVE EXAMPLE 2

Figure 6:
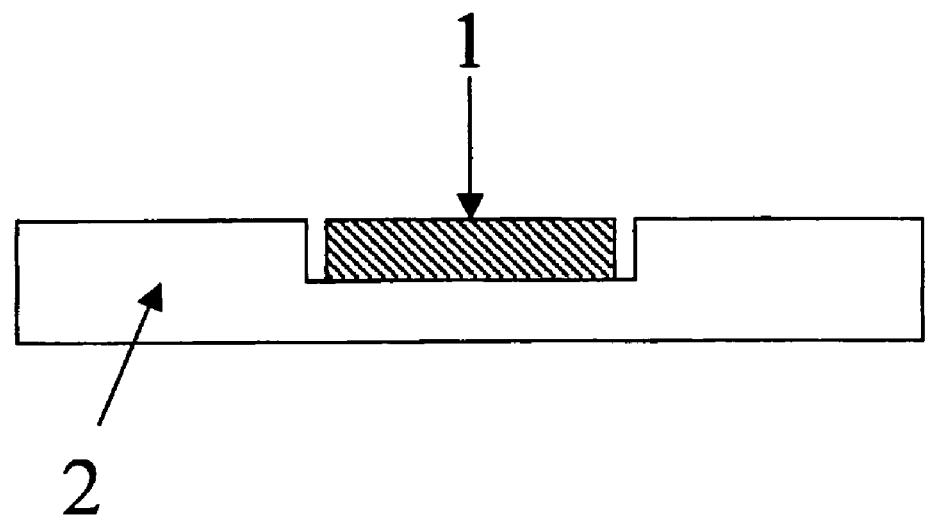
FIG. 6 is a schematic diagram of comparative example 2 with the depth of the concave of the silicon substrate equal to the plate thickness of the single crystalline diamond seed substrate.

As indicated in FIG. 6, an example of when the depth of the silicon substrate concave and the plate thickness of the single crystalline diamond seed substrate were equal will be described as comparative example 2. Here, single crystalline diamond seed substrate and silicon substrate with the same specifications as those of Example 1 were used, and the only point of difference was that the plate thickness of the single crystalline diamond seed substrate was 250 µm. The <Connecting step> was the same as in the Example, but when conducting the <Polishing step>, the single crystalline diamond seed substrate fell off at the time when the thickness of the CVD diamond layer on the single crystalline diamond seed substrate became thinner than 10 µm, and the seed substrate top surface could not be exposed. Therefore, this demonstrates that the single crystalline diamond seed substrate plate thickness needs to be thicker than the depth of the concave formed in the silicon substrate, and that the thickness of the diamond layer on the silicon substrate needs to be 10 µm or more.

EXAMPLE 2

This Example comprises the same 4 manufacturing steps as Example 1.

<Mounting Step>

Figure 7:
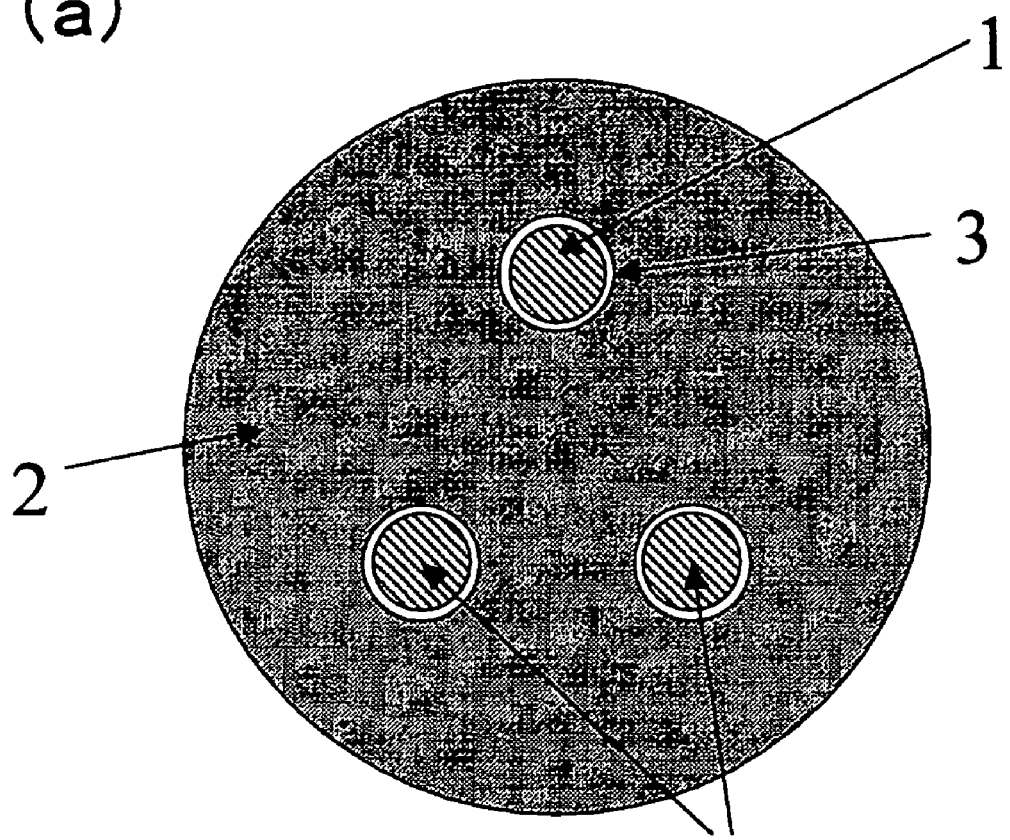
FIG. 7 is a schematic diagram of Example 2 after the mounting process.
Figure 7:
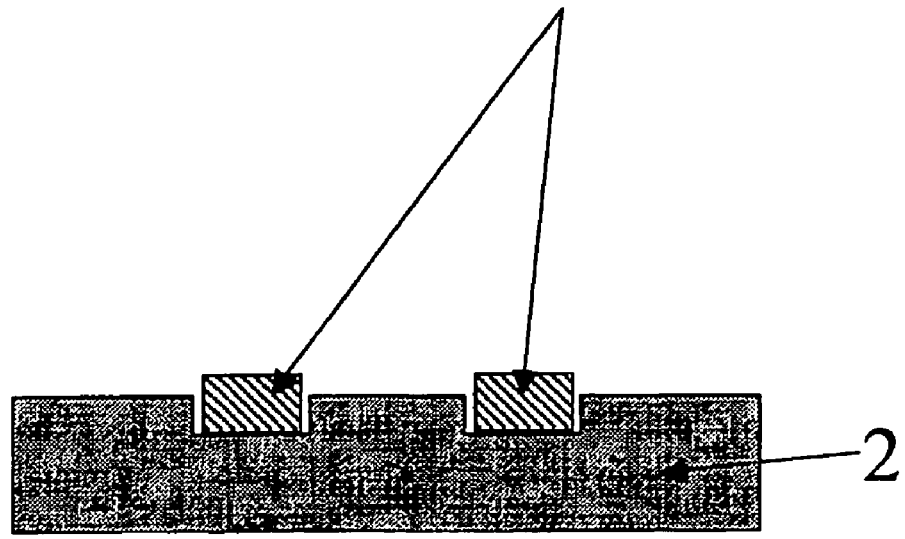

FIG. 7 is a schematic diagram of the mounting process. Three pieces of single crystalline diamond seed substrate were used. All were type IIa single crystalline diamond obtained by high-temperature high-pressure synthesis; the orientation of the main face was (111); and the size was a disk with a diameter of 2 mm, and a thickness of 100 µm. The main face of the silicon substrate 2 was (111) single crystalline substrate with a diameter of 2 inches and a thickness of 0.3 mm. As indicated in FIG. 7(a), three first regions 3 comprising concaves were formed on the main face of the silicon substrate by dry etching using a mask and high frequency plasma. The shape was cylindrical with a diameter of 2.05 mm and depth of 70 µm, and the side gap with respect to the single crystalline diamond seed substrate was 25 µm. As indicated in FIG. 7(b), after mounting the single crystalline diamond seed substrate, the stage difference between the main faces of the silicon substrate and the single crystalline diamond seed substrate was 30 µm.

<Connecting Step>

Here, both were connected using chemical vapor deposition by forming a CVD diamond layer on the main face part of the single crystalline diamond seed substrate and that of the silicon substrate. Known heat filament CVD was used to form the CVD diamond. The diamond synthesis conditions were: a ratio of methane flow rate (methane flow rate/hydrogen flow rate) of 0.5%; a silicon substrate temperature of 1050° C.; a pressure of $1.3 \times 10^4$ Pa; and a synthesis time of 30 hours.

Figure 8:
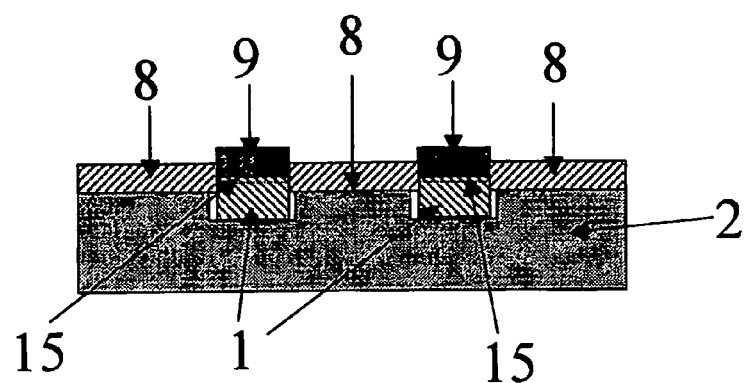
FIG. 8 is a cross-sectional schematic diagram of Example 2 after completing the connection process.

FIG. 8 is a schematic diagram after formation of the CVD diamond layer. The CVD diamond layer 8 formed on the silicon substrate and the CVD diamond layer 9 formed on the single crystalline diamond seed substrate were (111) oriented diamond. The thickness of the CVD diamond layer grown from the main face of the silicon substrate was 50±2.5 µm, and the thickness of the CVD diamond layer which grew from the main face of the single crystalline diamond seed substrate was 60 µm.

For the orientation of the CVD diamond layer, the surface shape was observed using a scanning electron microscope (SEM), then it was confirmed that the surface part was formed from triangular (111) facets. The diffraction angle was measured by the θ/2θ method using a X-ray diffraction apparatus with a copper sphere. At approximately 44°, at which the diffraction angle 2θ is the (111) diffraction peak, the diffraction intensity percentage was approximately 1.4 times that of random orientation diamond powder, and therefore (111) oriented diamond was confirmed.

Further, the condition inside the crystal was observed by optical microscope while focusing on points in the depth direction from the growth surface on the single crystalline diamond seed substrate. As indicated in FIG. 8, the results confirmed the presence of crack regions 15 generated on the single crystalline diamond seed substrate and CVD diamond layer near the surface boundary of the single crystalline diamond seed substrate and the CVD diamond layer grown thereon (FIG. 8).

<Polishing Step>

Polishing was conducted under the same conditions as the <Polishing step> in Example 1, but the polishing time up to exposure of the single crystalline diamond seed substrate was 35 hours. The plate thickness of the diamond substrate after polishing was 0.31 mm. The amount of substrate warpage was: the top surface (diamond surface) was −10 µm and the rear surface (silicon surface) was +10 µm. The cracks present near the surface boundary between the single crystalline diamond seed substrate and the CVD diamond layer which grew thereon, which were observed in the connecting process, completely disappeared because they had been removed by polishing. A diamond substrate, in which single crystalline diamond seed substrate with a main face of (111) and surrounded by (111) oriented diamond, was thereby obtained.

<Evaluation Step>

Here, the bonding strength of the single crystalline diamond seed substrate and the (111) oriented diamond that grew from the silicon substrate main face was evaluated. The evaluation method was to fix an attachment rod to the single crystalline diamond seed substrate having the face orientation (111), to tension the attachment rod perpendicularly from above, and to measure the adhesive force (bonding strength) when the single crystalline diamond seed substrate peeled off. The measured results determined an adhesive force of 5.6 kgf.

For comparison, samples in which the circumference of the single crystalline diamond seed substrate was covered by polycrystalline diamond were produced. The shape conditions of the single crystalline diamond seed substrate and silicon substrate, etc. were the same as the aforementioned, and only the diamond forming conditions were varied by adopting the juncture conditions of the <Connecting step> in Example 1. At this time, it was confirmed that the circumference of the single crystalline diamond seed substrate was covered by polycrystalline diamond and not by (111) oriented film. In addition, the adhesive force of the diamond substrate, which was obtained by applying the same <Polishing step> as the aforementioned, was measured. The adhesive force in the measured results was 3.8 kgf, and was lower than the value when the circumference was covered by (111) oriented diamond. Therefore, it was demonstrated that the bonding strength between (111) oriented diamond and the single crystalline diamond seed substrate is superior.

In order to identify the accurate surface orientation of the single crystalline diamond seed substrate exposed to the surface, the ω scanning and X-ray total reflection methods were combined to measure the substrate top surface orientation. The results demonstrated that the single crystalline diamond seed substrate top surface was oriented in a direction with a 0.5° discrepancy from the (111) plane.

Next, a CVD diamond film added with phosphine as an impurity was formed on the diamond substrate after all the steps were completed. The gases used were hydrogen, methane and phosphine, and the flow rate ratio was 1 million to 1000 to 5, respectively. The temperature of the diamond substrate during film formation was 900° C., and when forming the film for 60 hours, single crystalline diamond grew on the single crystalline diamond seed substrate to a film thickness of 30 μm.

When subsequently using the 4 terminal method to measure the room temperature resistivity of the diamond film that grew on the main face of the single crystalline diamond seed substrate, the resistivity displayed $2.0 \times 10^3$ Ω·cm. It was determined by measuring holes that the single-crystalline diamond layer was an n-type semiconductor. Secondary ion mass spectrometry revealed that $3 \times 10^{19}/cm^3$ of phosphorus was present in the diamond, thereby confirming that the diamond which grew on the single crystalline diamond seed substrate was a phosphorus doped semiconductor.

To make comparisons, phosphorus doped single crystalline diamond was grown under the same conditions as above on high-temperature high-pressure synthetic type IIa single crystalline diamond substrate with a main face orientation of (100). When measuring the room temperature resistivity of the surface after film formation by the 4 terminal method, the resistivity was $1.0 \times 10^7$ Ω·cm, indicating insulative property. These results demonstrate that the diamond substrate of the present invention can be suitably used as a semiconductor device.

EXAMPLE 3

In the present Example, the CVD diamond formation conditions during the <Connecting step> were modified, then an example will be described of when the amount of warpage of the diamond substrate after connecting and polishing has been changed.

<Mounting Step>

Seven samples were prepared in the same way as in the <Mounting step> of Example 2.

<Connecting Step>

The CVD diamond forming conditions were the same as those of the <Connecting step> of Example 2 except for the temperature of the silicon substrate. The substrate temperature was varied in the range of 800 to 1100° C., and the warpage of the top surface (diamond surface) after formation of the various samples was set at −20 to +80 μm, and the warpage of the rear surface (silicon surface) was set at −20 to +20 μm. The thickness distribution of the diamond layer on the silicon substrate here was in the range of 5 to 90 μm respectively.

<Polishing Step and Evaluation Step>

The same <Polishing step> as that in Example 1 was conducted and the warpage of both surfaces after polishing were measured. Further, the photoresist coating described in the <Evaluation step> of Example 1 was carried out, and pattern formation were tested using a stepper and an aligner. The results are shown in Table 1 below.

TABLE 1

| Substrate No. | Top surface warpage [μm] | Rear surface warpage [μm] | Polishing time [hours] | Pattern formation when using stepper | Pattern formation when using aligner |
|---|---|---|---|---|---|
| i | +2.5 | +0.5 | 98 | Good | Good |
| ii | −1.5 | +6.2 | 145 | Good | Good |
| iii | −9.9 | +9.3 | 150 | Good | Good |
| iv | −10.3 | +11.7 | 178 | Partially defective | Good |
| v | +9.9 | −8.1 | 151 | Good | Good |
| vi | +8.5 | −9.6 | 155 | Good | Good |
| vii | +10.5 | −10.9 | 189 | Partially defective | Good |

The results of Table 1 demonstrate that when the warpage is within ±10 μm, the diamond substrate can be applied for both a stepper and an aligner.

EXAMPLE 4

The present Example will explain the following examples: the polishing conditions in the <Polishing step> were modified, thereby, as shown in the FIG. 4, the groove width 12 of the groove 11 generated in the junction region around the single crystalline diamond seed substrate after polishing the top surface was varied and also the stage difference 14 between the single crystalline diamond seed substrate and the CVD diamond layer was varied.

<Mounting Step>

Five samples were prepared in the same way as the <Mounting step> of Example 2.

<Connecting Step>

The same <Connecting step> as in Example 2 was used.

<Polishing Step>

Polishing was conducted in the same manner as in the <Polishing step> in Example 1, and the polishing load was varied in the range of 1 to 9 kg for the individual samples. Polishing was completed when the single crystalline diamond seed substrate was exposed on the top surface.

<Evaluation Step>

The maximum width, depth, and stage difference of the groove produced on the perimeter of the seed substrate when polishing was completed were measured; the sample was then coated with resist, and the film thickness distribution of the resist was measured by the same method as in Example 1. The results are shown in Table 2.

TABLE 2

| Polishing load [kg] | Depth of groove [μm] | Width of groove [μm] | Stage difference [μm] | Resist film thickness distribution (%) |
|---|---|---|---|---|
| 4 to 6 | 2.9 | 19.2 | 1.1 | 1.0 |
| 1 to 6 | 2.7 | 19.9 | 1.3 | 11 |
| 4 to 8 | 3.2 | 22.1 | 1.0 | 27 |
| 5 to 7 | 3.8 | 19.9 | 1.0 | 13 |
| 9 | 4.3 | 21.8 | 1.3 | 31 |

This demonstrates that the resist film thickness distribution is restricted to 1% or less when the maximum depth, width, and stage difference of the groove produced on the perimeter of the seed substrate when polishing was completed were 3 μm or less, 20 μm or less, and 1.2 μm or less, respectively.

EXAMPLE 5

In the present Example, an example in which the amount of stage difference was changed in the <Mounting step> will be described.

<Mounting Step>

The disk-shaped single crystalline diamond seed substrate prepared was type Ib single crystalline diamond obtained by high-temperature high-pressure synthesis. The size was a diameter of 2 mm, and a thickness varied in 10 μm increments from 260 μm to 450 μm.

The silicon substrate was a single crystal substrate with a main face of (111), a diameter of 2 inches, and a thickness of 0.3 mm. One concave centered on the silicon substrate main face was formed by dry etching using a mask and high frequency plasma. The shape was cylindrical with a diameter of 2.1 mm and a depth of 250 μm, and the amount of gap when mounting the single crystalline diamond seed substrate in the silicon substrate concave was 50 μm.

Samples were prepared such that the amount of stage difference of the single crystalline diamond seed substrate was varied in 10 μm increments from 10 μm to 400 μm. For each stage difference, 100 samples were used, a total of 4000 samples.

<Connecting Step>

The main faces of the single crystalline diamond seed substrate and the silicon substrate were connected by forming a diamond layer over both by means of chemical vapor deposition. Known microwave plasma CVD was used to form the CVD diamond. The diamond synthesis conditions were adjusted at a ratio of methane flow rate (methane flow rate/hydrogen flow rate) of 3%, a silicon substrate temperature of 1000° C., and a pressure of $1.2 \times 10^4$ Pa, and synthesis was conducted until the film thickness became the same as the amount of stage difference.

The CVD diamond layer formed on the silicon substrate and the CVD diamond layer formed on the single crystalline diamond seed substrate were both polycrystalline bodies.

<Polishing Step>

The CVD diamond layer that grew on the single crystalline diamond seed substrate and on the silicon substrate main face was mechanically polished by using a self-revolving dry polishing device. The polishing load was 4 kg. Polishing was ended when the single crystalline diamond seed substrate was exposed. Whether the single crystalline diamond seed substrate was exposed was determined by Raman spectroscopic measurements in the same way as in the <Evaluation step> of Example 1.

Figure 9:
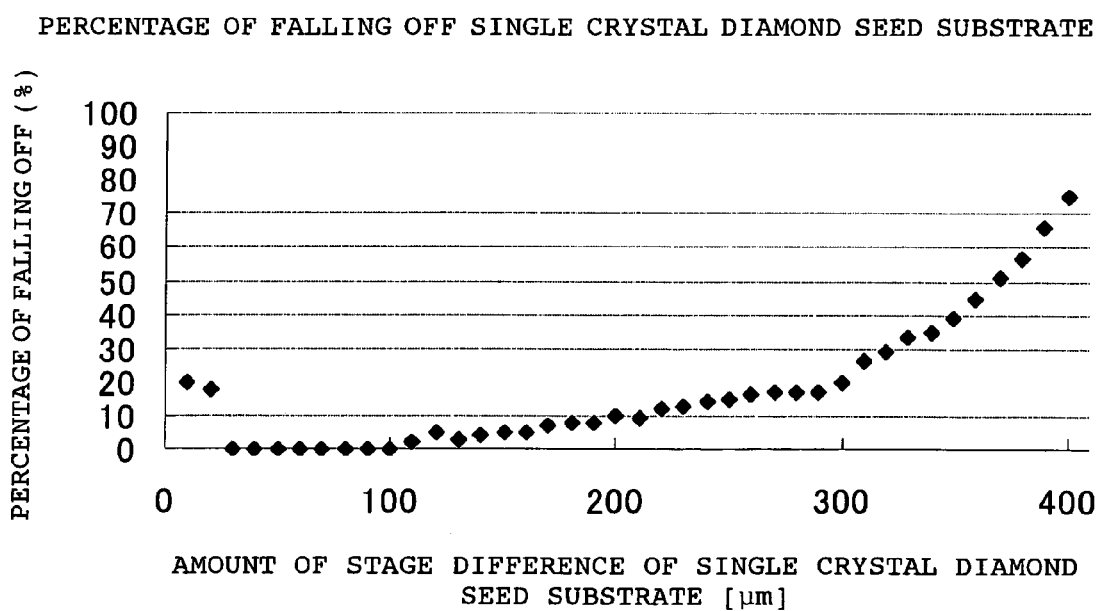
FIG. 9 is a graph of the results of Example 5 indicating the rate of falling off single crystalline diamond seed substrate with respect to the amount of stage difference.

The ratio of falling off the single crystalline diamond seed substrate when varying the amount of stage difference of the single crystalline diamond seed substrate is indicated in the graph of FIG. 9. The rate of falling off indicates that the percentage of single crystalline diamond seed substrate lost per 10 samples when 10 samples of each amount of stage difference were polished. As demonstrated in FIG. 9, when the amount of stage difference of the single crystalline diamond seed substrate was 30 μm to 100 μm, the single crystalline diamond seed substrate didn't fall off at all in the polishing step, but the loss of single crystalline diamond seed substrate gradually tended to increase as the discrepancy from the aforementioned range was larger.

Falling off the single crystalline diamond seed substrate was occurred during polishing as the amount of stage difference was varied, demonstrating the dependence of loss on the amount of stage difference. It is thereby possible to prevent falling off the single crystalline diamond seed substrate and improve the yield of diamond substrate production.

EXAMPLE 6

The present Example explains that it is possible to prevent falling off the single crystalline diamond seed substrate in the <Polishing step> by optimizing the amount of gap in the <Mounting step>.

<Mounting Step>

The disk-shaped the single crystalline diamond seed substrate prepared was a Ib type single crystalline diamond obtained by high-temperature high-pressure synthesis. The size was a diameter of 2.0 mm and a thickness of 330 μm.

The silicon substrate was a single crystal substrate with a main face of (111), and the size was a diameter of 2 inches and thickness of 0.3 mm. One concave centered on the silicon substrate main face was formed by dry etching using a mask and high frequency plasma. Silicon substrates of various shapes were prepared by varying the diameter from 2.0 mm to 2.3 mm in 10 μm increments. The silicon substrate concave was cylindrical with a depth of 250 μm, and the single crystalline diamond seed substrate was mounted in the silicon substrate concave.

Samples with the amount of gap varied from 0 μm to 300 μm in 10 μm increments were prepared, and 100 samples were used for every amount of gap, a total of 3100 samples. The amount of stage difference of the single crystalline diamond seed substrate here was 80 μm.

<Connecting Step>

The main faces of the single crystalline diamond seed substrate and the silicon substrate were connected by forming a diamond layer over both by means of chemical vapor deposition. Known microwave plasma CVD was used to form the CVD diamond. The diamond synthesis conditions were controlled at a ratio of methane flow rate (methane flow rate/hydrogen flow rate) of 3%, a silicon substrate temperature of 1000° C., and a pressure of $1.2 \times 10^4$ Pa, and synthesis was conducted until the film thickness became the same as the amount of stage difference, which was 80 μm. The synthesis time was approximately 27 hours. The CVD diamond layer formed on the silicon substrate and the CVD diamond layer formed on the single crystalline diamond seed substrate were both polycrystal bodies.

<Polishing Step>

Polishing was conducted by the same method as in the <Polishing step> in Example 5, and polishing was ended when the single crystalline diamond seed substrate was exposed. Whether the single crystalline diamond seed substrate had been exposed was determined by Raman spectrometry in the same way as the <Evaluation step> in Example 1.

Figure 10:
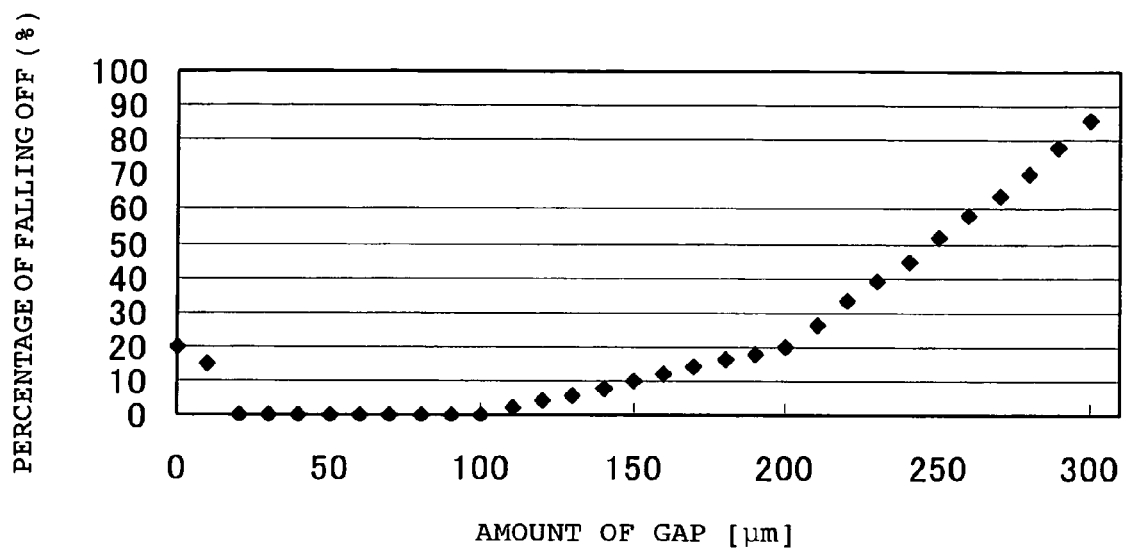
FIG. 10 is a graph of the results of Example 6 indicating the rate of falling off single crystalline diamond seed substrate with respect to the amount of gap.

The rate of falling off the single crystalline diamond seed substrate when varying the amount of gap is indicated in the graph in FIG. 10. The definition of loss rate was the same as that in the <Polishing step> in Example 5. As displayed in FIG. 10, when the amount of gap was 0 μm to 200 μm, the single crystalline diamond seed substrate didn't fall off at all in the polishing step. The loss of single crystalline diamond seed substrate gradually tended to increase as the amount of gap became greater than 200 μm.

Some of the single crystalline diamond seed substrate fell off during polishing as the amount of gap was varied, demonstrating the dependence of loss on the amount of gap. It is thereby possible to prevent falling off the single crystalline diamond seed substrate and improve the yield of diamond substrate production.

EXAMPLE 7

In the present Example, both the amount of stage difference and the amount of gap were varied in the <Mounting step>, and the relationship between the amount of stage difference and the amount of gap of the single crystalline diamond seed substrate was derived in order that the single crystalline diamond seed substrate does not fall off in the <Polishing step>.

<Mounting Step>
The disk-shaped single crystalline diamond seed substrate prepared was type Ib single crystalline diamond obtained by high-temperature high-pressure synthesis. The size was a diameter of 2 mm, and a thickness varied in 10 μm increments from 260 μm to 450 μm.

The silicon substrate was a single crystal substrate with a main face of (111), and the size was a diameter of 2 inches and thickness of 0.3 mm. One concave centered on the silicon substrate main face part was formed by dry etching using a mask and high frequency plasma. Silicon substrates of various shapes were prepared by varying the diameter from 2.0 mm to 2.3 mm in 10 μm increments.

Samples were prepared for the amount of stage difference of the single crystalline diamond seed substrate varied from 10 μm to 200 μm in 10-μm increments and also for the amount of gap varied from 0 μm to 300 μm in 10 μm increments. Ten samples each for every amount of stage difference and every amount of gap, 6200 samples in total were used.

<Connecting Step>
This step was the same as the <Connecting step> in Example 5.

<Polishing Step>
Polishing was conducted by the same method as that in the <Polishing step> of Example 5, and polishing was ended when the single crystalline diamond seed substrate was exposed. Whether the single crystalline diamond seed substrate was exposed was determined by Raman spectrometry in the same way as the <Evaluation step> in Example 1.

Figure 11:
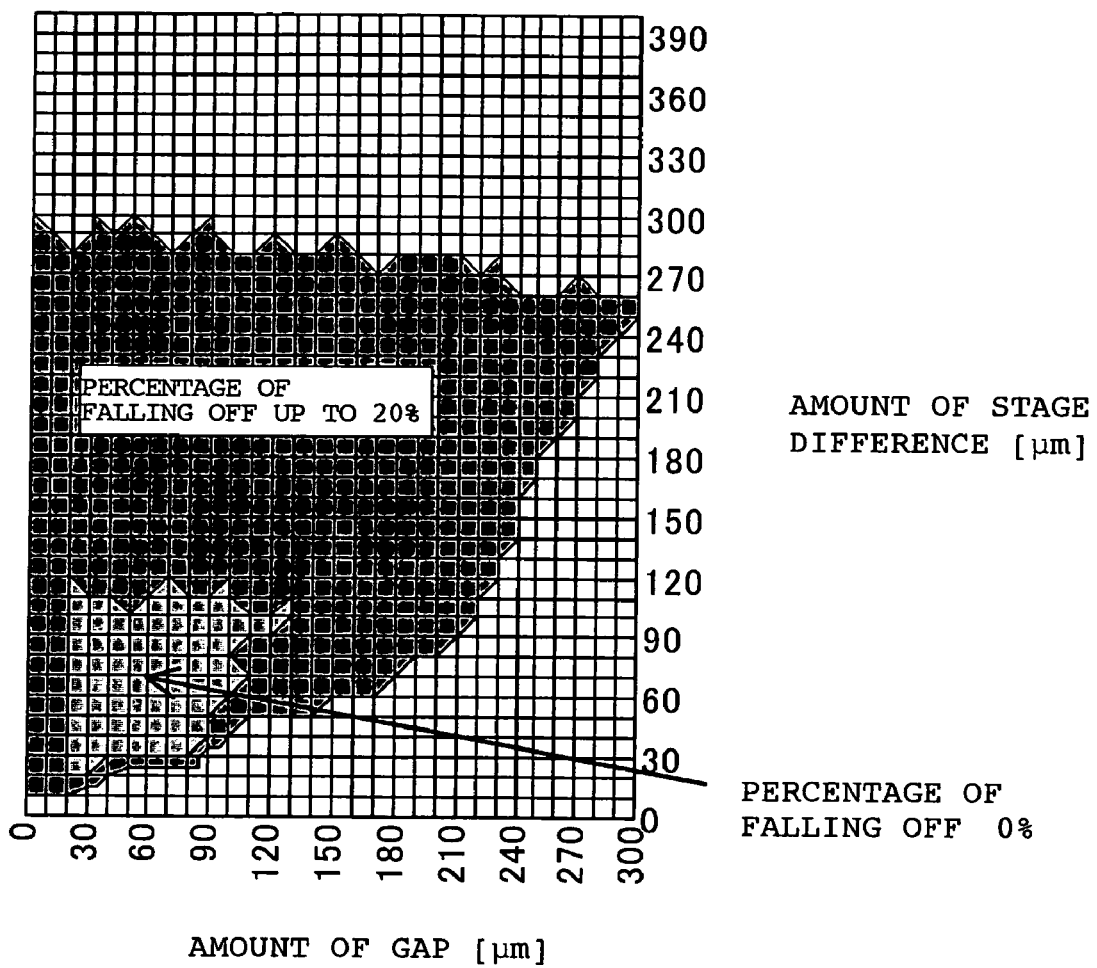
FIG. 11 is a graph of the results of Example 7 indicating the amount of stage difference, amount of gap, and the rate of falling off single crystalline diamond seed substrate.

Indicated in FIG. 11 is the region where the rate of falling off the single crystalline diamond seed substrate was 0% when varying the amount of stage difference and the amount of gap. The definition of the rate was the same as in Example 5. As demonstrated in FIG. 11, the single crystalline diamond seed substrate didn't fall off by polishing when the ratio of the amount of stage difference to the amount of gap was roughly 0.3 or more and 120 or less.

Some of the single crystalline diamond seed substrate fell off during polishing by varying the amount of stage difference and the amount of gap, demonstrating the dependence of loss on both the amount of stage difference and the amount of gap. It is thereby possible to prevent falling off the single crystalline diamond seed substrate and improve the yield of diamond substrate production.

EXAMPLE 8

The present Example will describe the production of a diamond substrate using a Si substrate that was a thick plate in the <Mounting step>, and then the addition of a step that thins the Si substrate plate thickness by surface grinding the back surface of the Si substrate in the final step. The individual steps then become: <Mounting step>, <Connecting step>, <Polishing step>, and finally <Surface grinding step>.

<Mounting Step>
The single crystalline diamond seed substrate prepared was disk-shaped and a Ib type single crystalline diamond obtained by high-temperature high-pressure synthesis. The size was a diameter of 2 mm and a thickness of 280 μm.

The main face of the silicon substrate was (111) single crystal substrate, and the size was a diameter of 1 inch and a thickness of 3 mm. Four concaves were formed in the silicon substrate main face by dry etching using high-frequency plasma. The shape was a diameter of 2.1 mm and a depth of 200 μm.

From the above, the amount of stage difference of the single crystalline diamond seed substrate was 80 μm, and the amount of gap was 50 μm. One sample was prepared.

<Connecting Step>
This step was the same as the <Connecting step> in Example 5.

<Polishing Step>
Polishing was conducted by the same method as that in the <Polishing step> of Example 5, and polishing was ended when the single crystalline diamond seed substrate was exposed. Whether the single crystalline diamond seed substrate was exposed was determined by Raman spectrometry in the same way as the <Evaluation step> in Example 1. There was no falling off of single crystalline diamond seed substrate in the present polishing step, and the diamond substrate was polished to a mirror finish across the entire surface.

<Surface Grinding Step>
A surface grinder was used to grind down 2.5 mm of the plate thickness of the Si substrate part, which was the rear face of the diamond substrate. A GC whetstone was used as the grinding whetstone, and surface grinding was ended at 500 turns with each grinding down 5 μm. The plate thickness of the diamond substrate including the CVD diamond layer was 580 μm, and the substrate was easily adapted to wafer processing by thinning the Si substrate.

EXAMPLE 9

Figure 12:
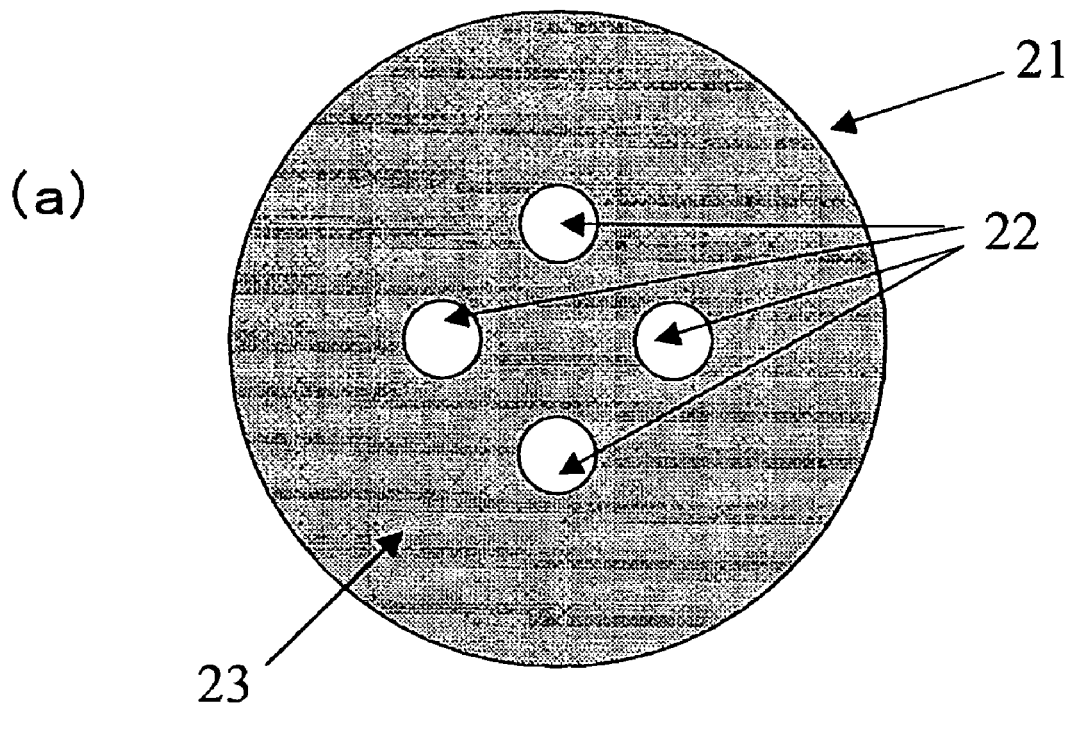
FIG. 12 is an example of a conductive substrate of the present invention. (a) is a top-view schematic diagram of the conductive substrate. (b) is a side-view schematic diagram of the conductive substrate.
Figure 12:
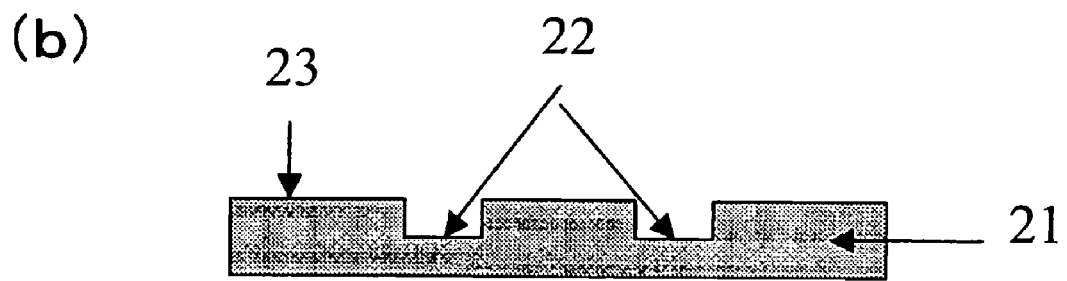
Figure 13:
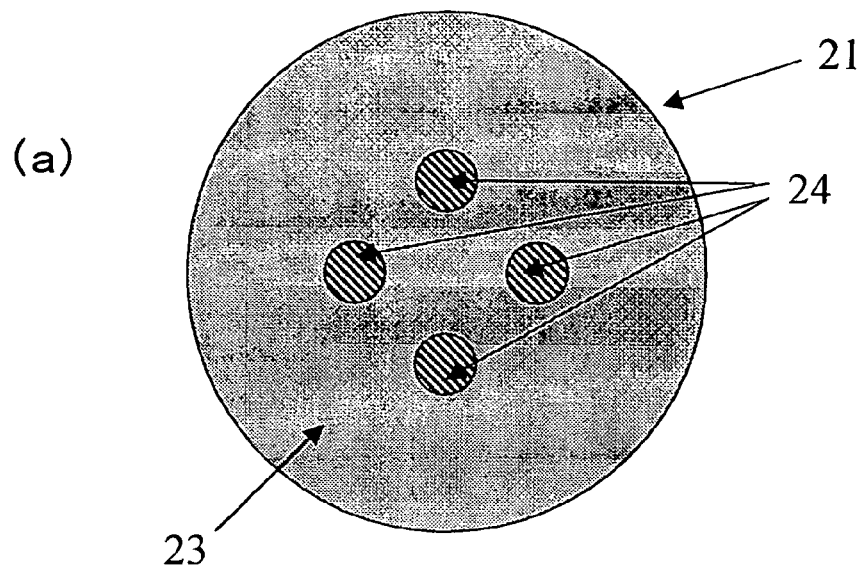
FIG. 13 is an example of conductive single crystalline diamond mounted on conductive substrate. (a) is a top-view schematic diagram of the mounted conductive single crystalline diamond. (b) is a side-view schematic diagram of the mounted conductive single crystalline diamond.
Figure 13:
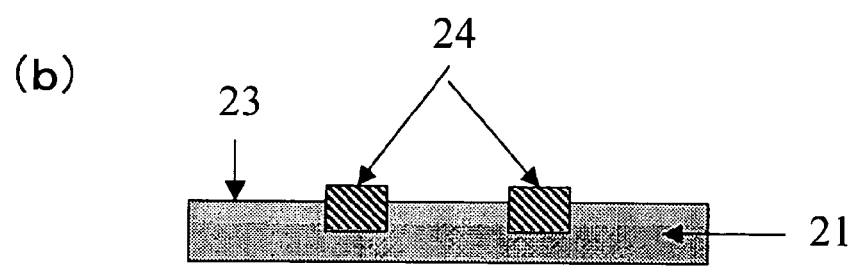

In the present Example, an example in which a boron doped single crystal silicon substrate was used as the conductive substrate 21, and a conductive diamond was formed thereon will be described. The surface orientation of this conductive substrate 21 was (100), and the size was a diameter of 2 inches and a thickness of 1 mm. The resistivity was $9.0 \times 10^{-2}$ Ω·cm. Four concaves 22 (first region) were shaped into circular when viewed from above were formed on this conductive substrate 21 (FIG. 12). The diameter of concave 22 was 2 mm and the depth was 0.2 mm. Naturally produced type IIb conductive single crystalline diamond seed substrates 4 were mounted in these concaves 22 (FIG. 13). The size of the disk-shaped substrate 24 was a diameter of 1.95 mm and a thickness of 0.25 mm; the resistivity was $1.0 \times 10^{-2}$ Ω·cm; and the main face orientation was (100).

Figure 14:
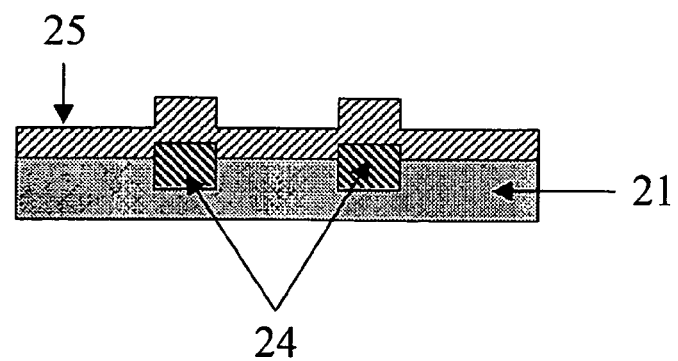
FIG. 14 is a schematic diagram when a conductive polycrystalline diamond film has been formed on a conductive substrate and conductive single crystalline diamond.

Next, chemical vapor deposition (CVD) was used to grow conductive diamond 25 on this conductive substrate 21 and conductive single crystalline diamond substrate 24. The apparatus for the growth was a known heat filament CVD apparatus; the gasses used were hydrogen, methane and diborane; and the ratio of respective flow rates was 1 million to 10,000 to 1. When setting the filament temperature to 2050° C. and the substrate temperature to 900° C. and growing the diamond for 60 hours, a film of conductive polycrystalline diamond 25 was formed on the conductive substrate 21 and conductive single crystalline diamond substrate 24 (FIG. 14). The film thickness of the conductive polycrystalline diamond 25 formed on the conductive substrate 21 and conductive single crystalline diamond substrate 24 was 60 μm, and the warpage of the back surface of the conductive substrate 21 was not more than 1 μm. It was confirmed that the conductive single crystalline diamond substrate 24 and the conductive substrate 21 were firmly connected through the conductive polycrystalline diamond 25. The resistivity of this diamond substrate was $9.5 \times 10^{-2}$ Ω·cm.

Figure 15:
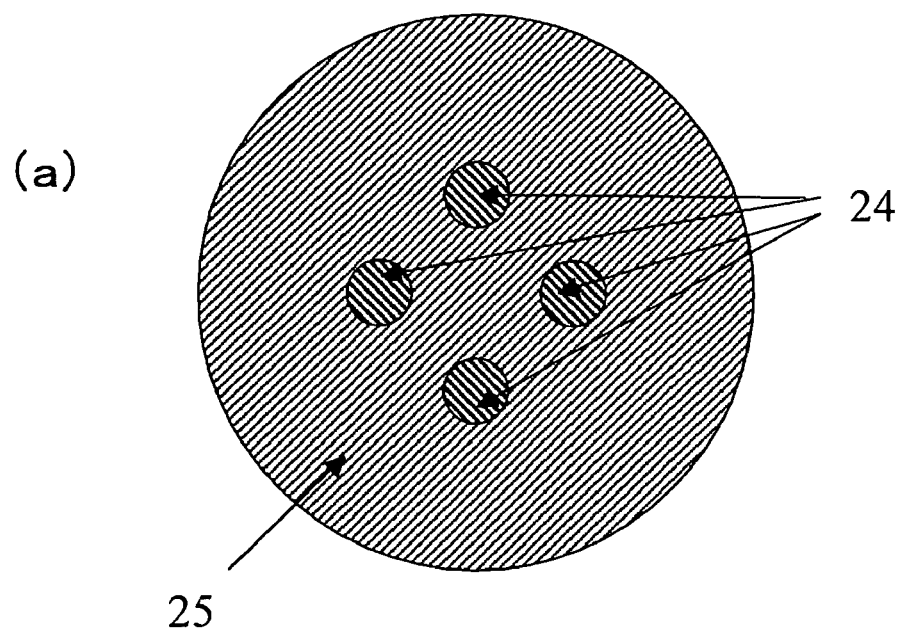
FIG. 15 is an example of a polished conductive polycrystalline diamond. (a) is a top-view schematic diagram of the polished conductive polycrystalline diamond. (b) is a side-view schematic diagram of the polished conductive polycrystalline diamond.
Figure 15:
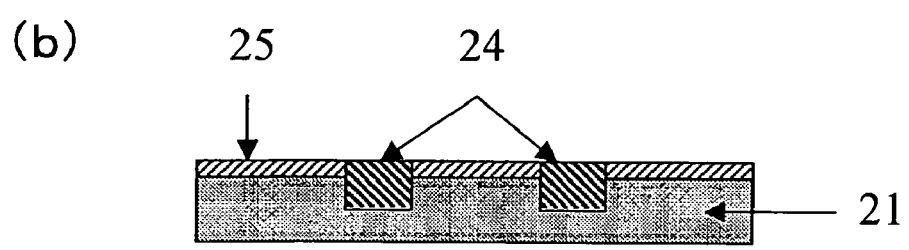

Next, 60 μm of the conductive polycrystalline diamond 25 side of this diamond substrate was mechanically polished from the peak area. As a result, a flat surfaced diamond substrate with conductive single crystalline diamond 24 appearing on the surface was obtained, as shown in FIG. 15. In this state it was confirmed that the conductive single crystalline diamond substrate 24 was firmly connected to the conductive substrate 21 through the conductive polycrystalline diamond 25.

Figure 16:
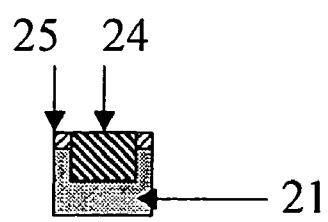
FIG. 16 is an example of the diamond substrate cut out by electric discharge machining.

Next, when a photoresist was spin coated on this diamond substrate, the film thickness distribution showed 1% or less on the surface, then a uniform coating was confirmed. By using a contact type aligner in this state, 1 μm width microfabrication could be processed onto the conductive single crystalline diamond, and the applicability to semiconductor wafer processing could be confirmed. Further, as displayed in FIG. 16, a region with a 3 mm diameter, which included the conductive single crystalline diamond 4 part, could be easily cut out by wire electric discharge machining. When forming titanium electrodes on this cut-out device by vapor deposition on top and bottom surfaces, satisfactory ohmic characteristics were exhibited on the top and bottom surfaces, demonstrating the back-feed capabilities.

COMPARATIVE EXAMPLE 3

An example of utilizing an insulating substrate will be described as comparative example 3. A silicon substrate that was not doped with impurities was used as the substrate for mounting the diamond. The silicon not doped with impurities was an intrinsic semiconductor and it was insulative with a resistivity of $1.0 \times 10^5$ Ω·cm or more at room temperature. The concaves 22 were formed on this substrate in the same way as in FIG. 12. Type IIa single crystalline diamond substrate 24 obtained from high-temperature high-pressure synthesis was used as the single crystalline diamond substrate. The size and orientation were the same as those in Example 9. This single crystalline diamond substrate 24 was insulative with a room temperature resistivity of $1.0 \times 10^5$ Ω·cm or more.

These substrates were arranged as in FIG. 13, and chemical vapor deposition for diamond was conducted using the same model heat filament CVD apparatus as in the previous Example 9. The gases used were hydrogen and methane, and the flow rate percentage was 100 to 1. Other than the gas, the film formation conditions were the same as in the previous Example 9, and as a result of forming a diamond film, polycrystalline diamond 25 with a thickness of 60 μm was formed on the silicon substrate 21 and the single crystalline diamond substrate 24. Subsequently, the diamond side was smoothed and polished and titanium electrodes were formed on the top and bottom surfaces by vapor deposition with the same methods as in Example 9, but the resistivity between electrodes was $1.0 \times 10^5$ Ω·cm or more, so the device was insulative. Consequently, it was demonstrated that this device could not be used as a semiconductor device as is.

COMPARATIVE EXAMPLE 4

Figure 17:
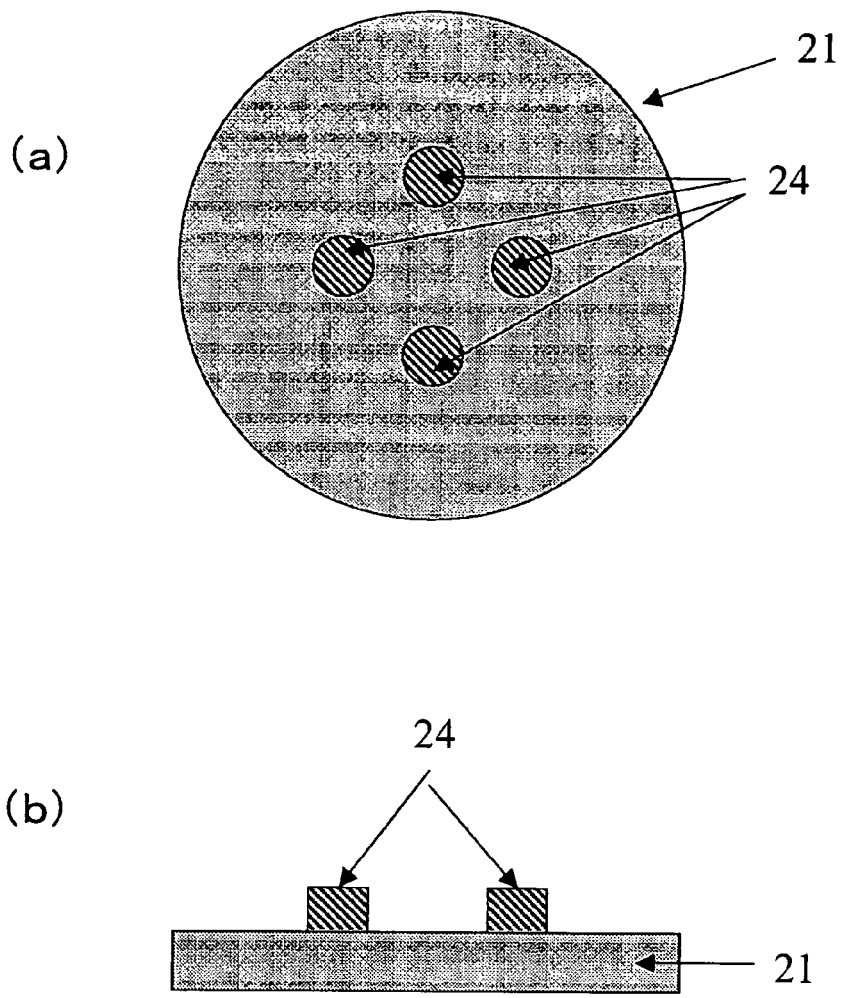
FIG. 17 is a comparative example with conductive single crystalline diamond mounted on a conductive substrate not provided with a concave. (a) is a top-view schematic diagram with conductive single crystalline diamond mounted on a conductive substrate not provided with a concave. (b) is a side-view schematic diagram conductive single crystalline diamond mounted on a conductive substrate not provided with a concave.
Figure 18:
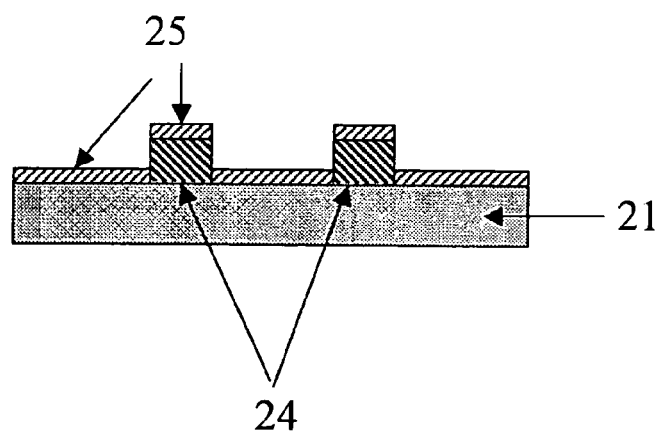
FIG. 18 is a side-view schematic diagram of a comparative example with conductive polycrystalline diamond film formed on a conductive substrate not provided with a concave.

Further, an example of mounting a conductive single crystalline diamond substrate 24 without forming a concave on the conductive substrate 21 surface will be described as comparative example 4. Here, except for the concaves of the conductive substrate 21, the types, sizes, orientations, and resistivities of the conductive substrate 21 and the conductive single crystalline diamond substrate 24 were the same as in the previous Example 9. These substrates were arranged as indicated in FIG. 17, and a diamond film was formed under the same conditions as in the previous Example 9. As a result, a conductive polycrystalline diamond 25 with a thickness of 60 μm was formed on the conductive silicon substrate 21 and the conductive single crystalline diamond substrate 24 (FIG. 18). At this time, the conductive polycrystalline diamond 25 formed on the second region and the conductive single crystalline diamond substrate 24 were connected, but subsequently when mechanical polishing was performed, the conductive single crystalline diamond 24 separated, demonstrating that the mechanical bonding strength of the two was inadequate.

EXAMPLE 10

In the present Example, an example in which a substrate of conductive silicon carbide sintered body was used as the conductive substrate 21 and a conductive diamond is formed thereon will be described. The size of this conductive substrate 21 was a diameter of 2 inches and thickness of 1 mm. The resistivity was $8.0 \times 10^{-3}$ Ω·cm. Four concaves 22 (first region) that were circular when viewed from above were formed on this conductive substrate 21 (FIG. 12). The diameter of the concaves 22 was 2 mm and the depth was 0.2 mm.

Type IIb conductive single crystalline diamond seed substrates 4, which were obtained by high-temperature high-pressure synthesis and included boron as an impurity, were placed in these concaves 22 (FIG. 13). The size of the disk-shaped substrate was a diameter of 1.95 mm and a thickness of 0.25 mm; the resistivity was $8.5 \times 10^{-2}$ Ω·cm; and the main face orientation was a 2° slant from (111).

Figure 19:
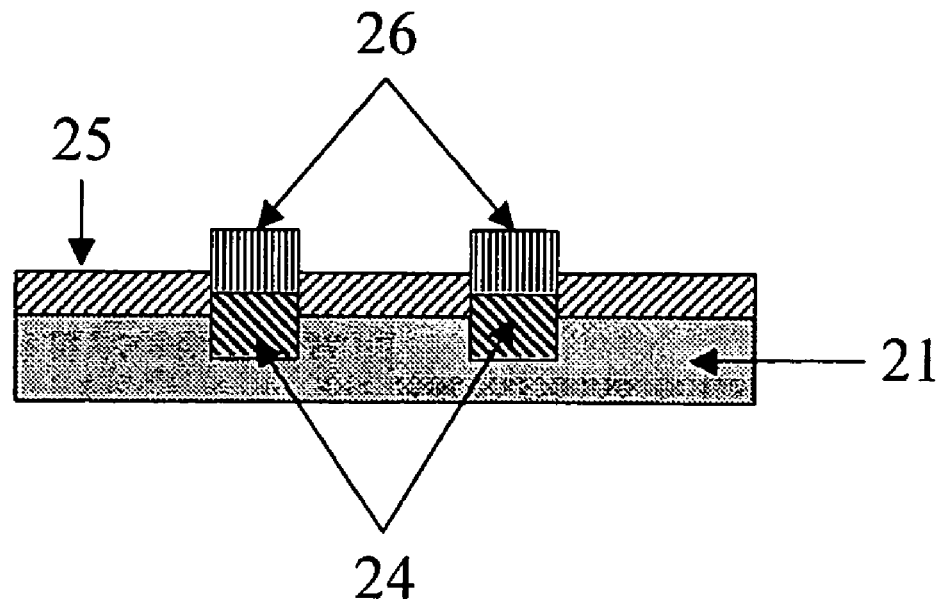
FIG. 19 is a side-view schematic diagram of Example 10.

Next, chemical vapor deposition (CVD) was employed to grow conductive diamond on this conductive substrate 21 and conductive single crystalline diamond substrate 24. The apparatus for the growth was a known microwave plasma CVD apparatus; the gasses used were hydrogen, methane and phosphine; and the ratio of respective flow rates was 1000 to 10 to 1. When introducing microwaves of frequency 2.45 GHz, controlling the introduction power to 5 kW and the substrate temperature to 1000° C. and growing the diamond for 60 hours, a film of conductive diamond 26 with a thickness of 60 μm was formed on the conductive substrate 21 and conductive single crystalline diamond substrate 4 (FIG. 19). It was confirmed that the conductive diamond on the conductive substrate 21 was polycrystalline diamond including phosphorus as an impurity, and the conductive diamond 26 on the conductive single crystalline diamond substrate 24 was a single crystalline diamond containing phosphorus as an impurity. The warpage of the back side of the conductive substrate 21 was 1 μm or less. It was confirmed that the conductive single crystalline diamond 24 and 26 parts and the conductive substrate 21 were firmly connected through the conductive polycrystalline diamond 25. The resistivities of these conductive single crystalline diamond 24 and 26 parts and the conductive polycrystalline diamond 25 part were $1.0 \times 10^2$ Ω·cm.

Figure 20:
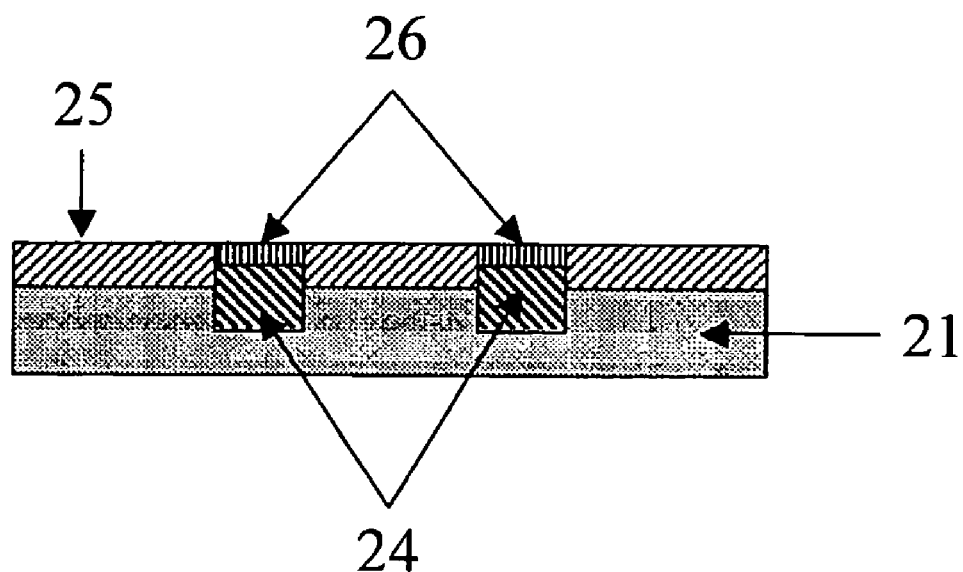
FIG. 20 is an example of Example 10 with part of the conductive diamond layer polished.

Next, 55 μm of the conductive diamond side of this diamond substrate was mechanically polished from the peak area. As a result, a flat top surfaced diamond substrate was obtained, as indicated in FIG. 20. In this state it was confirmed that the conductive single crystalline diamond substrates 24 and 26 were firmly bonded to the conductive substrate 21 through the conductive polycrystalline diamond 25.

Next, when a photoresist was spin coated on this diamond substrate, the film thickness distribution exhibited 1% or less on the surface, then a uniform coating was confirmed. By using a contact type aligner in this state, 1 μm width microfabrication could be processed onto the conductive single crystalline diamond, and the applicability to semiconductor wafer processing could be confirmed. In addition, an attempt was made to conduct the same wire electric discharge machining as in Example 9, but the resistivity was large, and the substrate could not be cut by electric discharge machining. Then, a region with a 3 mm diameter, which included a conductive single crystalline diamond part, was cut out by laser cutting. When forming aluminum electrodes on this cut-out device by high frequency sputtering on top and bottom surfaces, the top and bottom surfaces exhibited satisfactory ohmic characteristics, demonstrating the back-feed capabilities. This device was put in a vacuum, and it was confirmed that electrons were emitted from the conductive single crystalline diamond part at 100 mA when supplying 200 V negative voltage to the back side.

As described above, the diamond substrate produced by the methods represented in the Examples revealed that they were large area conductive diamond substrates that could be utilized in semiconductor wafer processing.

The invention claimed is:

1. A method for manufacturing a diamond substrate, comprising:
    a mounting step of preparing a substrate having a main face comprising a first region which is a concave and a second region which surrounds the first region, and mounting, on the first region, a single crystalline diamond seed substrate having a plate thickness thicker than a depth of the concave of the first region;
    a connecting step of forming a CVD diamond layer from the single crystalline diamond seed substrate by a chemical vapor deposition, and mutually connecting by forming a CVD diamond layer on the second region at the same time; and
    a polishing step of polishing to substantially flatten both the CVD diamond layer on the single crystalline diamond seed substrate and the CVD diamond layer on the second region by mechanically polishing.

2. A method for manufacturing a diamond substrate according to claim 1, wherein the substrate having a main face is a silicon substrate.

3. A method for manufacturing a diamond substrate according to claim 2, wherein a shape of the first region, when viewed from above the main face, is a circle, ellipse, or rounded polygon, the rounded polygon having rounded corners, and each of the rounded corners having a corner radius of 50 μm or more.

4. A method for manufacturing a diamond substrate according to claim 2, wherein a shape of the single crystalline diamond seed substrate to be mounted in the first region, when viewed from above the main face, is a circle, ellipse, or rounded polygon, the rounded polygon having rounded corners, and each of the rounded corners having a corner radius of 50 μm or more.

5. A method for manufacturing a diamond substrate according to claim 2, wherein an amount of stage difference, which is a stage difference between the main face of the single crystalline diamond seed substrate and the main face of the silicon substrate, is 30 μm or more and 100 μm or less.

6. A method for manufacturing a diamond substrate according to claim 2, wherein an amount of gap, which is a gap between the single crystalline diamond seed substrate and the concave of the first region, is 200 μm or less.

7. A method for manufacturing a diamond substrate according to claim 2, wherein a relationship between an amount of stage difference, which is a stage difference between the main face of the single crystalline diamond seed substrate and the main face of the silicon substrate, and an amount of gap, which is a gap between the single crystalline diamond seed substrate and the concave of the first region, is a ratio of the amount of stage difference to the amount of gap of 0.3 or more and 120 or less.

8. A method for manufacturing a diamond substrate according to claim 2, wherein the main face of the single crystalline diamond seed substrate has a face orientation of (111).

9. A method for manufacturing a diamond substrate according to claim 2, wherein the main face of the silicon substrate is a single crystal with a face orientation of (111).

10. A method for manufacturing a diamond substrate according to claim 2, wherein the CVD diamond layer formed on the second region is a polycrystalline diamond.

11. A method for manufacturing a diamond substrate according to claim 2, wherein the CVD diamond layer formed on the second region is a (111) oriented diamond.

12. A method for manufacturing a diamond substrate according to claim 2, wherein a warpage of a top surface of the diamond substrate after the polishing step is within ±10 μm.

13. A method for manufacturing a diamond substrate manufacturing method according to claim 2, wherein a warpage of a rear surface of the diamond substrate after the polishing step is within ±10 μm.

14. A method for manufacturing a diamond substrate according to claim 2, wherein a thickness of the CVD diamond layer on the second region after the polishing step is 10 μm or more.

15. A method for manufacturing a diamond substrate according to claim 2 wherein a groove is produced during the polishing step and the groove surrounds all or part of a surface of the single crystalline diamond seed substrate.

16. A method for manufacturing a diamond substrate according to claim 15, wherein a depth of the groove surrounding the single crystalline diamond seed substrate is 3 μm or less, and a width thereof is 20 μm or less.

17. A method for manufacturing a diamond substrate according to claim 1, wherein the substrate having a main face is a conductive substrate; the single crystalline diamond seed substrate is a conductive single crystalline diamond seed substrate; and the CVD diamond layer is a conductive polycrystalline diamond layer.

18. A method for manufacturing a diamond substrate according to claim 17, wherein the conductive polycrystalline diamond layer includes a conductive single crystalline diamond layer grown epitaxially.

19. A method for manufacturing a diamond substrate according to claim 17, wherein resistivities of the conductive substrate and the conductive polycrystalline diamond layer are $1\times10^{-1}$ Ω·cm or less.

20. A method for manufacturing a diamond substrate according to claim 17, wherein the conductive single crystalline diamond seed substrate and the conductive polycrystalline diamond layer include as an impurity at least one element selected from the group consisting of hydrogen, lithium, boron, nitrogen, aluminum, silicon, phosphorus and sulfur.

21. A method for manufacturing a diamond substrate according to claim 17, wherein the conductive substrate comprises at least one material selected from the group consisting of silicon, silicon carbide, silicon nitride, aluminum nitride and boron nitride.

22. A method for manufacturing a diamond substrate according to claim 17, wherein the polishing step uses etching.

23. A method for manufacturing a diamond substrate according to claim 17, further comprising a step of cutting the diamond substrate by electric discharge machining after the polishing step.

24. A diamond substrate comprising:
a substrate having a main face comprising a first region, which is a concave, and a second region which surrounds the first region,
a plate-shaped single crystalline diamond part provided on the first region, and
a layer-shaped polycrystalline diamond part provided on the second region, wherein
the single crystalline diamond part is secured to the substrate by connecting with the polycrystalline diamond part, and the single crystalline diamond part and the polycrystalline diamond part are substantially flattened and unified.

25. A diamond substrate according to claim 24, wherein the substrate having a main face is a silicon substrate.

26. A diamond substrate according to claim 25, wherein a shape of the concave of the silicon substrate, when viewed from above the main face, is a circle, ellipse, or rounded polygon, the rounded polygon having rounded corners, and each of the rounded corners having a corner radius of 50 μm or more.

27. A diamond substrate according to claim 25, wherein a shape of the single crystalline diamond part, when viewed from above the main face, is a circle, ellipse, or rounded polygon, the rounded polygon having rounded corners, and each of the rounded corners having a corner radius of 50 μm or more.

28. A diamond substrate according to claim 25, wherein an amount of stage difference, which is a stage difference between the main face of the single crystalline diamond part and the main face of the silicon substrate, is 30 μm or more and 100 μm or less.

29. A diamond substrate according to claim 25, wherein an amount of gap, which is a gap between the single crystalline diamond part and the concave of the silicon substrate, is 200 μm or less.

30. A diamond substrate according to claim 28 or 29, wherein a relationship between the amount of stage difference and the amount of gap is a ratio of the amount of stage difference to the amount of gap of 0.3 or more and 120 or less.

31. A diamond substrate according to claim 25, wherein the main face of the single crystalline diamond part has a face orientation of (111).

32. A diamond substrate according to claim 25, wherein the main face of the silicon substrate is a single crystal with a face orientation of (111).

33. A diamond substrate according to claim 25, wherein the polycrystalline diamond part is a CVD diamond.

34. A diamond substrate according to claim 25, wherein the polycrystalline diamond part is a (111) oriented diamond.

35. A diamond substrate according to claim 25, wherein a warpage of a top surface of the diamond substrate is within ±10 μm.

36. A diamond substrate according to claim 25, wherein a warpage of a rear surface of the diamond substrate is within ±10 μm.

37. A diamond substrate according to claim 25, wherein a thickness of the polycrystalline diamond part on the silicon substrate is 10 μm or more.

38. A diamond substrate according to claim 25, wherein there is a groove surrounding all or partially the single crystalline diamond part.

39. A diamond substrate according to claim 38, wherein a depth of the groove is 3 μm or less, and a width thereof is 20 μm or less.

40. A diamond substrate according to claim 24, wherein the substrate having a main face is a conductive substrate; the single crystalline diamond part is conductive; and the polycrystalline diamond part is conductive.

41. A diamond substrate according to claim 40, wherein the conductive single crystalline diamond part contains a conductive single crystalline diamond layer grown epitaxially.

42. A diamond substrate according to claim 40, wherein resistivities of the conductive single crystalline diamond part, the conductive polycrystalline diamond part and the conductive substrate are $1\times10^{-1}$ Ω·cm or less.

43. A diamond substrate according to claim 40, wherein the conductive single crystalline diamond part and the conductive polycrystalline diamond part include as an impurity at least one element selected from the group consisting of hydrogen, lithium, boron, nitrogen, aluminum, silicon, phosphorus and sulfur.

44. A diamond substrate according to claim 40, wherein the conductive substrate comprises at least one material selected from the group consisting of silicon, silicon carbide, silicon nitride, aluminum nitride and boron nitride.

* * * * *